US011680968B2

(12) United States Patent
Thompson et al.

(10) Patent No.: US 11,680,968 B2
(45) Date of Patent: Jun. 20, 2023

(54) ADDRESSING CIRCUIT FOR CONDUCTOR ARRAYS

(71) Applicant: Lenexa Medical Pty Ltd, Balwyn (AU)

(72) Inventors: Martin Neil Thompson, Victoria (AU); William Sing Ho Yang, Victoria (AU); Ajit Ravindran, Victoria (AU)

(73) Assignee: Lenexa Medical Pty Ltd, Balwyn (AU)

( * ) Notice: Subject to any disclaimer, the term of this patent is extended or adjusted under 35 U.S.C. 154(b) by 267 days.

(21) Appl. No.: 17/250,860

(22) PCT Filed: Sep. 11, 2019

(86) PCT No.: PCT/AU2019/050976
§ 371 (c)(1),
(2) Date: Mar. 12, 2021

(87) PCT Pub. No.: WO2020/051639
PCT Pub. Date: Mar. 19, 2020

(65) Prior Publication Data
US 2022/0214387 A1 Jul. 7, 2022

(30) Foreign Application Priority Data
Sep. 12, 2018 (AU) .................... 2018903433

(51) Int. Cl.
*G01R 27/02* (2006.01)
*G01R 27/26* (2006.01)
(Continued)

(52) U.S. Cl.
CPC .............. *G01R 27/02* (2013.01); *G01L 1/205* (2013.01); *G01L 1/225* (2013.01); *G01L 5/228* (2013.01);
(Continued)

(58) Field of Classification Search
CPC ........ G01R 27/00; G01R 27/02; G01R 27/26; G01R 27/2605; G01R 31/00; G01R 31/28;
(Continued)

(56) References Cited

U.S. PATENT DOCUMENTS 3,723,660 A * 3/1973 Gerke .................... H01H 63/40
340/2.2
4,112,332 A * 9/1978 Veith .................... H01J 17/498
345/71
(Continued)

FOREIGN PATENT DOCUMENTS

WO WO 2017/093602 6/2017

OTHER PUBLICATIONS

International Search Report and Written Opinion for PCT/AU2019/050976 dated Dec. 3, 2019.
(Continued)

*Primary Examiner* — Hoai-An D. Nguyen
(74) *Attorney, Agent, or Firm* — Knobbe, Martens, Olson & Bear, LLP

(57) ABSTRACT

Embodiments generally relate to an addressing circuit for a conductor array comprising intersecting row and column conductors. The addressing circuit comprises a switching circuit configured to selectively address an intersection between a selected row conductor and a selected column conductor for connection to a measuring circuit; and at least one voltage buffer selectively connectable to un-selected column conductors on opposite sides of and adjacent to the selected column conductor. The at least one voltage buffer is configured to equalise voltages between the un-selected column conductors and the selected column conductor.

20 Claims, 18 Drawing Sheets

(51) Int. Cl.
*G01L 1/20* (2006.01)
*G01L 1/22* (2006.01)
*G01L 5/22* (2006.01)
*G06F 3/044* (2006.01)
*G01D 5/24* (2006.01)

(52) U.S. Cl.
CPC ....... G01R 27/2605 (2013.01); G06F 3/0446 (2019.05); *G01D 5/24* (2013.01)

(58) Field of Classification Search
CPC .............. G01R 31/317; G01R 31/3177; G01R 31/3181; G01L 1/00; G01L 1/14; G01L 1/142; G01L 1/144; G01L 1/146; G01L 1/18; G01L 1/20; G01L 1/205; G01L 1/22; G01L 1/225; G01L 5/00; G01L 5/0061; G01L 5/0076; G01L 5/0085; G01L 5/009; G01L 5/22; G01L 5/226; G01L 5/228; G06F 3/00; G06F 3/01; G06F 3/03; G06F 3/041; G06F 3/0416; G06F 3/044; G06F 3/0446; G01D 5/00; G01D 5/24
USPC .......................................... 324/76.11, 123 R
See application file for complete search history.

(56) References Cited

U.S. PATENT DOCUMENTS

| 5,237,314 | A | * | 8/1993 | Knapp | G09G 3/3674 |
| | | | | | 349/24 |
| 5,379,050 | A | * | 1/1995 | Annis | G09G 3/367 |
| | | | | | 345/94 |
| 5,485,177 | A | * | 1/1996 | Shannon | G06F 3/0412 |
| | | | | | 345/207 |
| 5,812,106 | A | * | 9/1998 | Hughes | G09G 3/367 |
| | | | | | 345/91 |
| 7,715,228 | B2 | * | 5/2010 | Deak | G11C 11/1675 |
| | | | | | 365/158 |
| 8,085,260 | B2 | | 12/2011 | Derichs | |
| 2009/0067225 | A1 | * | 3/2009 | Mryasov | G11C 11/165 |
| | | | | | 365/158 |
| 2014/0039351 | A1 | | 2/2014 | Mix et al. | |
| 2022/0214387 | A1 | * | 7/2022 | Thompson | G01L 5/009 |

OTHER PUBLICATIONS

Written Opinion of the International Preliminary Examining Authority for PCT/AU2019/050976 dated Jul. 29, 2020.

* cited by examiner

ADDRESSING CIRCUIT FOR CONDUCTOR ARRAYS

FIELD

Described embodiments generally relate to an addressing circuit for conductor arrays.

BACKGROUND

Conductor arrays comprise intersecting row and column conductors, and an addressing circuit can be used to selectively address an intersection between each row conductor and each column conductor to measure changes in electrical characteristics at the intersection. The conductors may be in contact at the intersections, or may alternatively be electrically connected or separated by appropriate materials, including liquids and gasses.

Conductor arrays are used in a wide and diverse range of applications, including medical applications, human machine interfaces and sensing applications, etc. For example, conductor arrays may be used in touch pads or touch screens where measured changes in inductance at an intersection caused by the proximity of a human finger can be used to locate and track the movement of the finger. Similarly, conductor arrays can be arranged on robot limbs to simulate touch sensing by measuring impedance which can be related to forces and pressure at each intersection.

In medical applications, addressing circuits can be used to measure changes in electrical characteristics at the intersections of a conductor array to determine changes in pressure. Pressure sensing mats often comprise sensor nodes in the form of tactile sensor elements defined at the intersections between overlaid row conductors and column conductors arranged on the pressure sensing mat. Each tactile sensor element is referred to as a taxel and the combination of sensor elements forms a taxel array. Each taxel within the taxel array can be monitored for changes in electrical characteristics using an addressing circuit to determine, for example, pressure applied to the pressure sensing mat at the location of each taxel on the mat.

There is a need for an improved addressing circuit for conductor arrays. It is desired to address or ameliorate one or more shortcomings or disadvantages associated with prior methods and systems for addressing conductor arrays, or to at least provide a useful alternative thereto.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each of the appended claims.

SUMMARY

Some embodiments relate to an addressing circuit for a conductor array comprising intersecting row and column conductors, wherein the addressing circuit comprises:

a switching circuit configured to selectively address an intersection between a selected row conductor and a selected column conductor for connection to a measuring circuit; and at least one voltage buffer selectively connectable to un-selected column conductors on opposite sides of and adjacent to the selected column conductor;

wherein the at least one voltage buffer is configured to equalise voltages between the un-selected column conductors and the selected column conductor.

In some embodiments, the at least one voltage buffer comprises two voltage buffers.

In some embodiments, the measuring circuit comprises a transimpedance amplifier.

According to some embodiments, the switching circuit comprises an output demultiplexer configured to:

selectively connect the selected column to the transimpedance amplifier; and selectively connect the voltage buffers to the adjacent un-selected column conductors.

In some embodiments, the output demultiplexer is configured to simultaneously switch a feedback loop and an input of each of the transimpedance amplifiers and a feedback loop and an output of each of the at least one voltage buffers when connecting the selected column and the adjacent un-selected column conductors.

Some embodiments further comprise one or more analogue to digital converters for converting an analogue output of the transimpedance amplifiers into a digital input. Some embodiments further comprise a digital to analogue converter for converting a signal generated by a controller into a reference voltage for use by the analogue to digital converter.

Some embodiments further comprise at least one row buffer connected to each row conductor, each row buffer configured to control the voltage in each row conductor. Some embodiments further comprise a voltage source selectively connectable to the at least one row buffer.

In some embodiments, the at least one row buffer comprises two row buffers, being one row buffer selectively connectable between the selected row conductor and the voltage source, and one row buffer multiplexed to each unselected row conductor. According to some embodiments, the at least one row buffer comprises a plurality of row buffers, with one row buffer connected to each row conductor.

Some embodiments further comprise a digital to analogue converter for converting a signal generated by a controller into the voltage source for selectively connecting to each row buffer.

According to some embodiments, the switching circuit comprises a phase demultiplexer configured to selectively connect each row buffer to a precision resister. Some embodiments further comprise a phase demultiplexer configured to switch a feedback loop and an output when connecting each row buffer to the respective row conductor.

Some embodiments further comprise a controller for controlling selective connection of the row and column conductors to the switching circuit. According to some embodiments, the controller is configured to receive measured data from the measuring circuit and calculate the changes in at least one electrical characteristic of the selected row and column conductor pair. In some embodiments, the electrical characteristic comprises one or a combination of voltage, current, resistance, impedance, inductance, capacitance, or phase.

Some embodiments further comprise a digital to analogue converter for converting a signal generated by a controller into a common voltage for supplying to any voltage buffers, transimpedance amplifiers and row buffers of the addressing circuit.

According to some embodiments, the conductor array is a sheet formed of piezoelectric material with the row and column conductors arranged on opposing surfaces of the sheet.

In some embodiments, the selected column comprises two or more selected columns.

According to some embodiments, the voltage buffers act as current sinks.

In some embodiments, the voltage buffers are configured to set the voltage of the un-selected columns to be equal to the voltage of the input of the transimpedance amplifiers. In some embodiments, the voltage buffers are configured to set the voltage of the un-selected columns to a ground or common mode voltage.

According to some embodiments, the row buffers comprise operational amplifiers.

In some embodiments, the row buffers are configured to equalise the voltage of the unselected rows to the voltage of the input of the transimpedance amplifiers. In some embodiments, the row buffers are configured to equalise the voltage of the unselected rows by connecting them to a node voltage. According to some embodiments, the node voltage is ground.

In some embodiments, the circuit comprises filters on the transimpedance amplifier outputs.

Some embodiments relate to a scanning circuit for a taxel array comprising intersecting conductors arranged in rows and columns, the scanning circuit comprising:

a voltage source selectively connectable to a selected row conductor; a transimpedance amplifier, selectively connectable to a selected column conductor to measure current induced by the voltage source within the selected column conductor; and at least one voltage buffer selectively connectable to unselected column conductors on either side of the selected column conductor to isolate the selected column conductor from the unselected column conductors.

In some embodiments, the at least one voltage buffer comprises two voltage buffers.

According to some embodiments, the selected column conductor comprises two or more column conductors.

Some embodiments further comprise an output demultiplexer configured to selectively connect the transimpedance amplifier to each selected column, and to connect the voltage buffers to the unselected columns on either side of the selected column. According to some embodiments, the output demultiplexer is configured to simultaneously switch a feedback loop and an input of each of the transimpedance amplifiers and a feedback loop and an output of each of the at least one voltage buffers when connecting the selected column and the adjacent unselected column conductors.

In some embodiments, the transimpedance amplifier comprises a plurality of transimpedance amplifiers and the selected column comprises a plurality of adjacent columns each connected to one of the plurality of transimpedance amplifiers.

According to some embodiments, each row is connected to a row buffer to control the voltage within the row. In some embodiments, each row buffer is connected to a phase demultiplexer configured to connect each row buffer to a precision resistor. In some embodiments, the phase demultiplexer is configured to switch a feedback loop and an output of the selected row buffer when connecting the selected row buffer to the row conductor.

Some embodiments further comprise a controller for controlling selective connection of the voltage source, the transimpedance amplifiers, and the voltage buffers to the taxel array. In some embodiments, the controller is configured to calculate changes in electrical characteristics of the taxel array at each taxel. According to some embodiments, the electrical characteristics comprise one or a combination of voltage, current, resistance, impedance, inductance, capacitance, or phase.

Some embodiments further comprise one or more analogue to digital converters for converting an analogue output of the transimpedance amplifier into a digital input to the controller. Some embodiments further comprise a digital to analogue converter for converting a signal generated by a controller into a reference voltage for use by the analogue to digital converter.

In some embodiments, the taxel array is a sheet formed of piezoresistive or piezoelectric material with the rows and columns arranged on opposing surfaces of the sheet.

Some embodiments relate to a system for preventing the formation of pressure injuries comprising:

a taxel array in the form of a sheet of piezo-resistive material comprising conductors arranged in rows and columns on opposing sides of the sheet, wherein the sheet is configured to be positioned between a patient and a surface; and a scanning circuit as claimed in any one of claims 29 to 43 configured to analyse contact between the patient and the sheet, and identify locations where pressure injuries may occur.

Some embodiments further comprise a display, for displaying a graphic representation of forces, pressure or energy applied to the sheet.

According to some embodiments, the system is configured to generate an alert when risk of pressure injury formation passes a minimum threshold.

Some embodiments relate to a method for measuring a conductor array comprising intersecting row and column conductors, the method comprising:

selectively connecting a selected row conductor to a voltage source;

selectively connecting a selected column conductor to a measuring circuit;

selectively controlling the voltage of two unselected column conductors on either side of the selected column conductors to be equal to the selected column conductors to prevent current flow between the selected column conductors and the unselected current conductors.

Some embodiments further comprise selectively controlling the voltage of all unselected row conductors to be equal to the selected column conductor to prevent current flow between the selected column conductors and the unselected row conductors.

Some embodiments further comprise using the measuring circuit to measure at least one electrical characteristic of the conductor array at the intersection of the selected column and the selected row.

Some embodiments further comprise using the measured electrical characteristic of the conductor array at the intersection of the selected column and the selected row to determine a pressure being exerted onto the conductor array at the intersection of the selected column and the selected row.

Some embodiments further comprise disconnecting the selected row conductor from the voltage source and selectively connecting a new selected row conductor to the voltage source, and repeating until every row has been connected.

Some embodiments further comprise disconnecting the selected column conductor from the measuring circuit and selectively connecting a new selected column conductor to the measuring circuit, and repeating until every column has been connected for every row.

Some embodiments further comprise performing a frequency sweep.

Some embodiments further comprise using the data read by the measuring circuit to determine at least one vital sign of a patient positioned on the conductor array. According to some embodiments, the at least one vital sign comprises a heart rate. In some embodiments, the at least one vital sign comprises a respiratory rate.

Some embodiments further comprise using the data read by the measuring circuit to determine whether a patient is positioned on the conductor array.

Some embodiments further comprise using the data read by the measuring circuit to determine a height of a patient positioned on the conductor array.

Some embodiments further comprise using the data read by the measuring circuit to determine at least one position adopted by a patient positioned on the conductor array.

Some embodiments further comprise using the data read by the measuring circuit to monitor movement of a patient positioned on the conductor array.

Some embodiments relate to a system comprising the system of some other embodiments and an air mattress, wherein at least one valve of the air mattress is controllable based on at least one identified location where a pressure injury may occur.

According to some embodiments, at least one valve of the air mattress is controllable to cause a pressure in at least one air pocket of the air mattress to be varied based on the at least one identified location where a pressure injury may occur.

In some embodiments, the pressure of at least one air pocket corresponding to the at least one identified location is decreased. In some embodiments, the pressure of at least one air pocket adjacent to an air pocket corresponding to the at least one identified location is increased.

BRIEF DESCRIPTION OF DRAWINGS

Embodiments will now be described by way of example only with reference to the accompanying drawings, in which.

DESCRIPTION OF EMBODIMENTS

Figure 1:
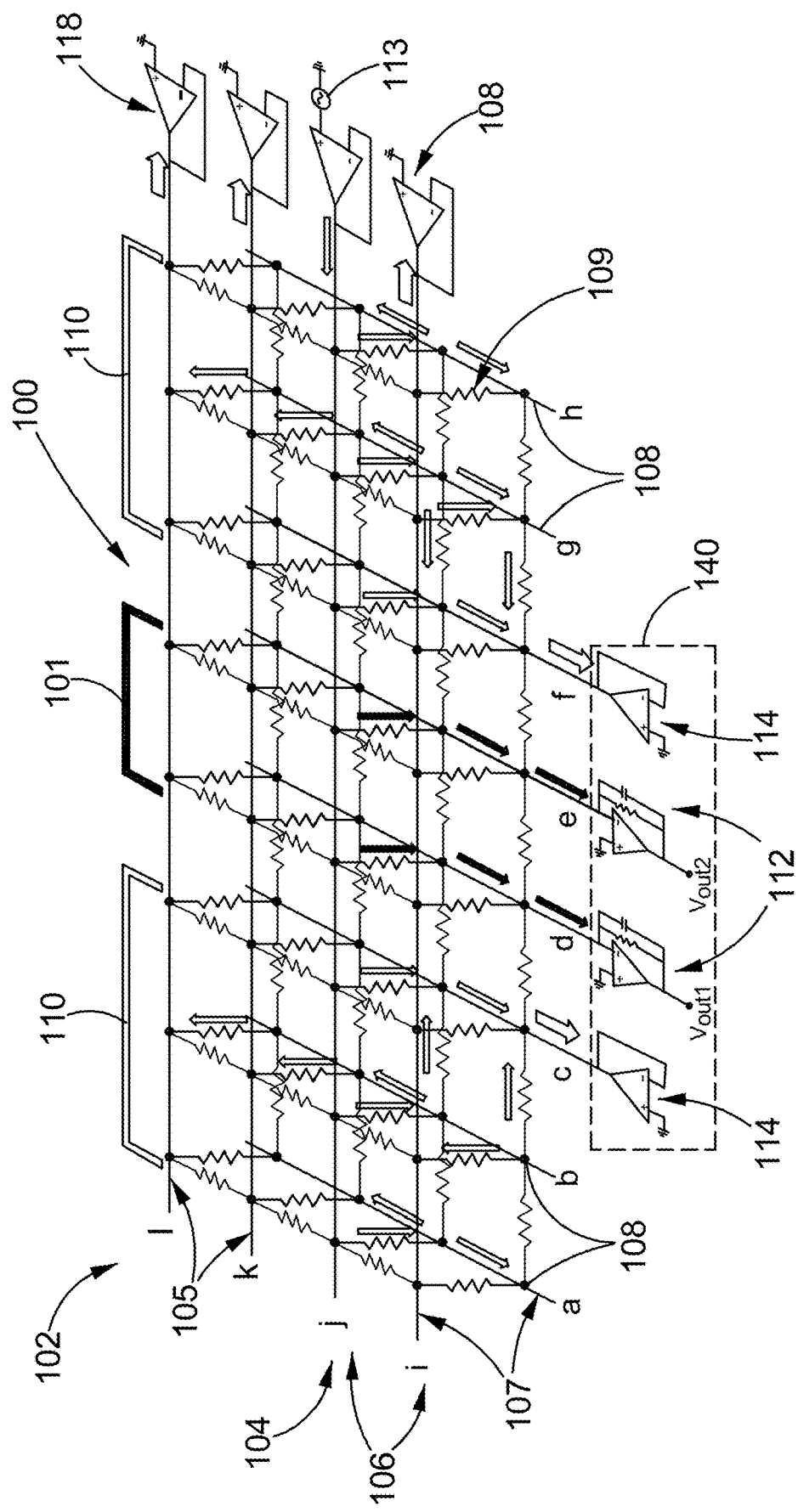
FIG. 1 is a schematic representation of a conductor array connected to elements of an addressing circuit in accordance with some embodiments.

Referring to the drawings, FIG. 1 generally depicts an addressing circuit 100 for addressing selected row 104 and column 101 conductors of a conductor array 102 in accordance with some embodiments. The conductor array 102 comprises a number of conductors 107, comprising intersecting row 106 and column 108 conductors. Conductor array 102 may comprise at least one row conductor 106 and at least one column 108 conductor. One row conductor 106 may be a selected row conductor 104, and one or more column conductors 108 may be selected column conductors 101. For the example embodiment shown in FIG. 1, the selected column 101 comprises a plurality of selected columns d, e which are addressed at respective intersections with selected row 104, which comprises row j. Conductor array 102 further comprises unselected rows 105 and unselected columns 110.

The addressing circuit 100 may be configured to connect the selected column conductor 101 to a measuring circuit 140 to measure changes in electrical characteristics between the selected row j and column 101 conductor pair. Measuring circuit 140 comprises voltage buffers 114 selectively connectable to unselected column conductors 110 on either side of and adjacent to the selected column conductor 101, being column conductors c and f in the illustrated embodiment. While two voltage buffers 114 are shown in the illustrated embodiments, some embodiments may have one voltage buffer multiplexed to unselected column conductors 110 on either side of and adjacent to the selected column conductor 101. Some embodiments may have more than two voltage buffers 114.

The voltage buffers 114 maintain the voltage of the unselected column conductors c, f equal to the voltage of the selected column conductors d, e, preventing current flow between the selected conductor 101 and the unselected column conductors 110. For the example shown in FIG. 1, the voltage buffers 114 may act as a current sink to sink current flow between the selected column 101 and the adjacent unselected columns 110 to prevent interference with any measurement on the selected columns 101. In some embodiments, the voltage buffers 114 may alternatively act as a current source, particularly when voltage source 113 connected to the selected row 104 generates a negative excitation voltage.

The voltage buffers 114 isolate (or "fence") the measurements of the measuring circuit 140 from any interference due to current flow in the unselected columns 110, by preventing current flow between the selected columns 101 and the unselected columns 110. For the example shown in FIG. 1, measuring circuit 140 further comprises a transimpedance amplifier 112 connected to each selected column 101 for measuring currents generated when a voltage source 113 is connected to the selected row 104. In some embodiments, measuring circuit 140 may alternatively comprise a different set of components configured to measure the currents generated when a voltage source 113 is connected to the selected row 104. For example, measuring circuit 140 may comprise a buffer having a resistor at its output before its feedback point in some embodiments.

According to some embodiments, circuit 100 may also allow for multiple un-adjacent columns 108 to be selected. In this case, the unselected columns 110 on either side of each selected column 101 must be connected to voltage buffers 114, with each selected column 101 being connected to a transimpedance amplifier 112. According to some embodiments, this may be implemented by patching a single voltage buffer 114 to each side of a given selected column 101, to act as a fence on either side of the selected column 101.

Addressing circuit 100 may further comprise a plurality of row buffers 118, each row buffer 118 connected to a row 106, and configured to control the voltage within the row 106. The buffers 118 may each comprise an operational amplifier selectively connectable to the voltage source 113. The row buffers 118, when not connected to the source 113 may be configured to equalise the voltage of un-selected rows 105, thereby preventing current flow between the un-selected rows 105. The row buffers 118 not connected to source 113 may further be configured to equalize the voltage between unselected rows 105 and selected column 101, thereby preventing current flow between unselected rows 105 and selected columns 101. In effect, this means that row buffers 118 should keep unselected rows 105 at a voltage equal to the voltage of buffers 114, and equal to the virtual voltage at the input of transimpedance amplifiers 112.

According to some embodiments, addressing circuit 100 may instead have a single row buffer 118 with a multiplexer configured to patch the single row buffer 118 to each unselected row 105. While this may result in voltage drops due to the on-resistances of the multiplexer, these resistances may be insignificant, being around 5Ω in some cases.

Addressing circuit 100 advantageously allows for scanning of continuous or semi-continuous sensor materials without introducing crosstalk, with a lower component count than some previous systems and/or being easier to implement than some previous systems. Addressing circuit 100 may also be used for addressing discrete elements.

Embodiments will now be described in more detail, by way of illustration only, with respect to the following example. The example is intended to serve to illustrate some embodiments only, and should not be construed as limiting the generality of the disclosure of the description throughout this specification.

Figure 2:
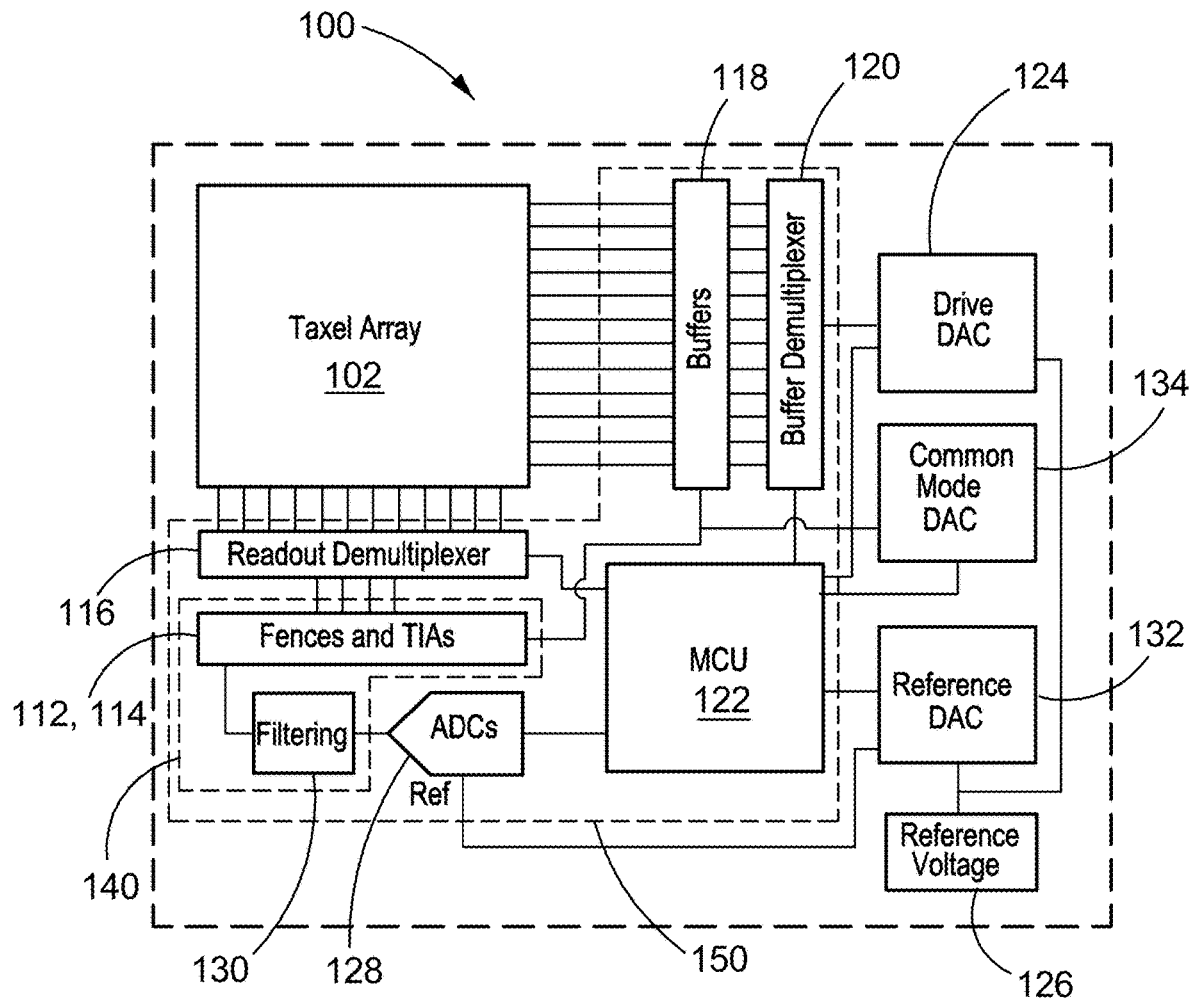
FIG. 2 is a block diagram representation of an addressing circuit for a conductor array in accordance with some alternative embodiments.
Figure 3:
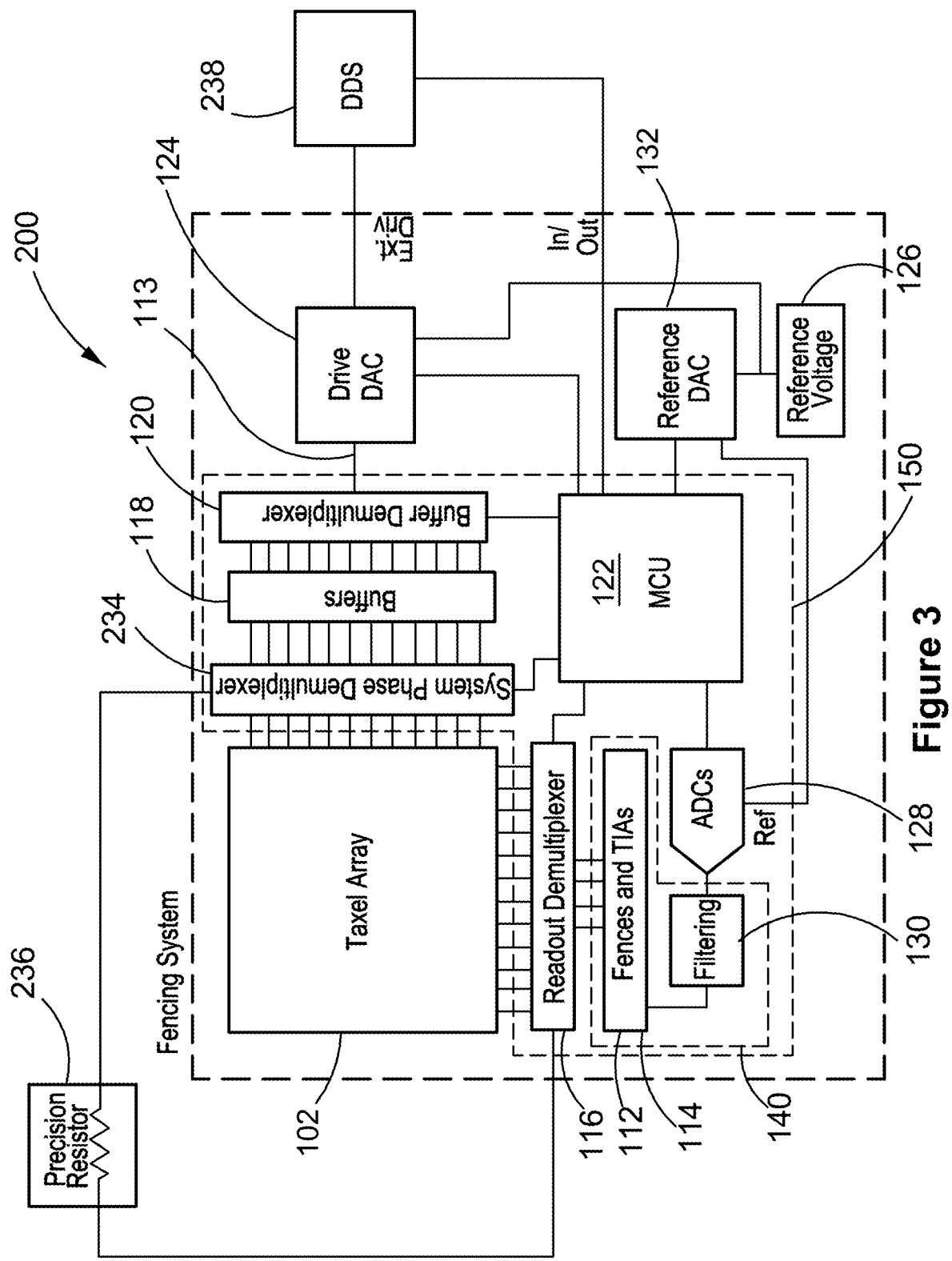
FIG. 3 is a block diagram representation an addressing circuit for a conductor array in accordance with some alternative embodiments.

With reference to the drawings, an example application of the addressing circuit 100 is described in relation to a scanning circuit 150 for a conductive array 102 where intersections between row and column conductors 106 and 108 of array 102 form taxels 109. Conductive array 102 is also referred to as taxel array 102. Taxels 109 may be tactile sensors in some embodiments, with an electrical characteristic of each taxel 109 varying with application of energy, such as mechanical pressure, for example. In some embodiments, taxels 109 may alternatively be caused to change an electrical characteristic based on application of acceleration, temperature, strain or force. FIGS. 1 and 2 in general depict an addressing circuit 100 comprising a scanning circuit 150 for a conductor array 102 comprising intersecting row conductors 106 and column conductors 108, forming taxels 109. FIG. 3 in general depicts an addressing circuit 200 comprising a scanning circuit 150 for a conductor array 102 comprising intersecting row conductors 106 and column conductors 108, forming taxels 109. Addressing circuit 100 of FIGS. 1 and 2 is configured to measure resistance of taxels 109, while addressing circuit 200 of FIG. 3 is configured to measure complex impedance of taxels 109, from which resistance, capacitance, inductance, phase and more may be derived.

The scanning circuit 150 of addressing circuit 100/200 is configured to selectively connect to each row conductor 106 and each column conductor 108. With reference to FIG. 1, the addressing circuit 100 comprises a measuring circuit 140 comprising one or more transimpedance amplifiers 112, selectively connectable to one or more adjacent columns 108 to measure current induced within the adjacent columns, by the voltage source 113. For the example shown in FIG. 1, two transimpedance amplifiers 112 are connected to columns d and e, being selected columns 101, to measure current induced by the potential difference between the voltage source 113 connected to selected row 104 and each transimpedance amplifier 112. The measuring circuit 140 further comprises two voltage buffers 114 selectively connectable to unselected columns 110, one on either side of the one or more selected columns 101 to isolate the one or more selected columns 101 from unselected columns 110. For the example shown in FIG. 1, the voltage buffers 114 are connected to columns c and f on either side of selected columns d and e, thereby isolating (also referred to as fencing) columns d and e from electrical activity in columns a to c and columns f to h.

As described in further detail below with reference to FIGS. 11A and 11B, simply exciting a row 106 by applying a source voltage to row 106 and measuring the current at a column 108 would not provide an accurate measure of the electrical properties at an addressed taxel 109, as doing so would cause backtalk and crosstalk interference to corrupt the measurement. Alternatively, an operational amplifier can be connected to each conductor row and each conductor column to control the voltage within each row and each column at various stages. However, as the number of rows and columns increases, the number of operational amplifiers increases correspondingly. The increased number of components results in larger circuit layout requirements and increased production costs, which is particularly undesirable in medical applications.

Instead, the described embodiments have the selected row 104 connected to source voltage 113, with the unselected rows 105 being at ground, or another common mode voltage. The selected columns 101 are connected to transimpedance amplifiers 112, while one column on either side of the selected columns 101 is connected to voltage buffers 114. Transimpedance amplifiers 112 read the current that flows from the selected row 104 through the addressed taxel 109 to the virtual ground of transimpedance amplifier 112, converting it to a voltage that can allow for a resistance of the taxel 109 to be determined. The voltage buffers 114 and row buffers 118 sink any crosstalk or backtalk, allowing transimpedance amplifiers 112 to measure the uncorrupted current and derive an accurate measurement of the electrical characteristics of taxel 109.

Advantageously, the suggested configuration does not require transimpedance amplifiers connected to each column 108, allowing, instead, for measurement of each column to be conducted selectively and if required, sequentially, using a reduced number of components. The voltage buffers 114 set the voltage of unselected columns c and f to be equal to the voltage of the input to the transimpedance amplifier 112 from columns d and e, thereby preventing current flow between selected columns d and e and the adjacent unselected columns c and f. The input voltage of the transimpedance amplifiers 112 and the voltage buffers 114 may be at ground potential, which is a virtual ground for transimpedance amplifiers 112.

Referring to FIG. 2, the addressing circuit 100 may comprise an output demultiplexer 116 also referred to as readout demultiplexer. The output demultiplexer 116 may be configured to selectively connect a number of transimpedance amplifiers 112 to the same number of adjacent columns 108, being the selected columns 101. The output demultiplexer 116 may comprise a switching circuit, configured to selectively connect the selected columns 101 to the transimpedance amplifiers 112, as well as the unselected columns 110 on either side of the selected columns 101 to the voltage buffers 114.

Figure 4:
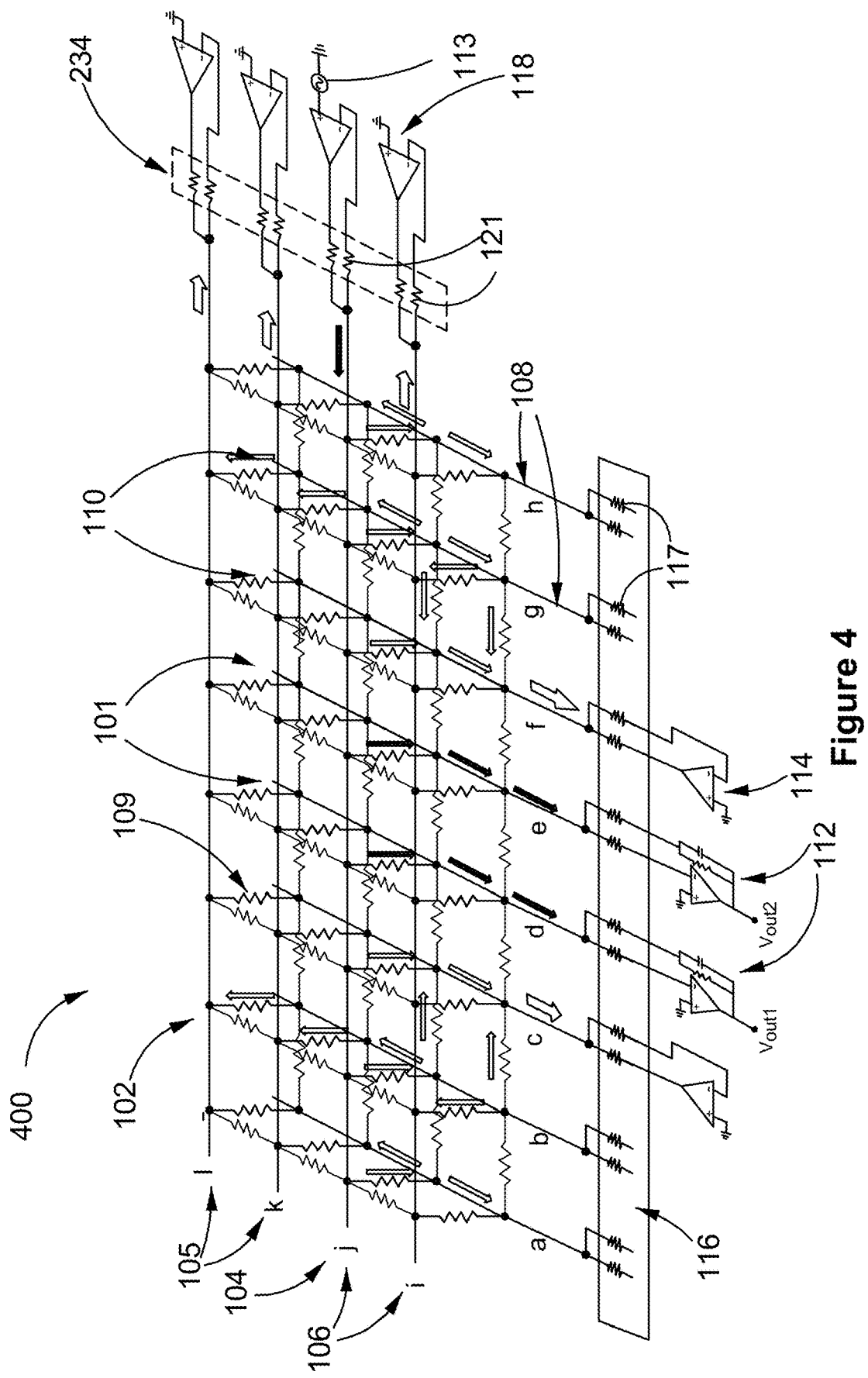
FIG. 4 is a schematic representation of a conductor array connected to elements of an addressing circuit in accordance with some alternative embodiments.

With reference to FIG. 4, the output demultiplexer 116 may be configured to simultaneously switch an input and a feedback loop of a connected transimpedance amplifier 112 and an output and a feedback loop of connected voltage buffers 114. Connecting the transimpedance amplifiers 112 and the voltage buffers 114 in this configuration may compensate for any effect caused by any intrinsic switching resistance within the demultiplexer 116. Resistors 117 and 121 represent the on-resistances of the switches within demultiplexers 116 and 120. By using two switches within demultiplexers 116 and 120, the resistances of resistors 116 and 120 can be applied to the feedback loops of the buffers and transimpedance amplifiers 112, 114 and 118. The input or output voltages of buffers and transimpedance amplifiers 112, 114 and 118 are then unaffected by the resistors 117 and 121.

Referring again to FIG. 2, as described above with reference to FIG. 1, the addressing circuit 100 may comprise a plurality of row buffers 118, each row buffer 118 connected to a row 106, configured to control the voltage within the row 106. Each buffer 118 may comprise an operational amplifier selectively connectable to the voltage source 113. The row buffers 118, when not connected to the source 113, may be configured to equalise the voltage of the un-selected rows 105, thereby preventing current flow between unselected rows 105. The row buffers 118 not connected to source 113 may further be configured to equalize the voltage between unselected rows 105 and selected column 101, thereby preventing current flow between unselected rows 105 and selected columns 101. In effect, this means that row buffers 118 should keep unselected rows 105 at a voltage equal to the voltage of buffers 114, and equal to the virtual voltage at the input of transimpedance amplifiers 112.

The addressing circuit 100 may comprise an input demultiplexer 120 (also referred to as a row buffer demultiplexer). The input demultiplexer 120 may be configured to selectively connect a row buffer 118 connected to a row 106, being the selected row 104, with the voltage source 113 to create a potential difference between the selected row 104 and any selected columns 101 to which transimpedance amplifiers 112 are connected. The input demultiplexer 120 may further be configured to connect each of the other buffers 118 that are connected to unselected rows 105 to a node voltage. The node voltage may be ground in some embodiments. The input demultiplexer 120 may comprise a switching circuit connected to each row 106 or each row buffer 118 to selectively connect the source voltage 113 to the row 106 or the row buffer 118 as required. According to some embodiments, input demultiplexer 120 and output demultiplexer 116 may together comprise a switching circuit. With reference to FIG. 4, the input demultiplexer 120 may comprise input intrinsic resistances 122.

As for the example shown in FIG. 2, the addressing circuit 100 may comprise a controller 122 for controlling functions within the addressing circuit 100. The controller 122 may control selective connection of the voltage source 113 to each row 106. The controller 122 may control the input demultiplexer 120 to selectively connect the voltage source 113 to each buffer 118. The controller 122 may control selective connection of the transimpedance amplifiers 112 to adjacent columns 108. The controller 122 may control selective connection of the voltage buffers 114 to the columns on either side of the selected columns 101, being the columns connected to the transimpedance amplifiers 112. The controller 122 may control switching of the output demultiplexer 116 to control selective connection of the transimpedance amplifiers 112 and the buffers 118. The controller 122 may be a microcontroller.

In some embodiments, the addressing circuit 100 may comprise one or more digital to analogue converters (DACs) 124, 132, 134. The DAC 124 may be configured to convert a digital signal generated by controller 122 to an analogue signal based on reference voltage 126. The output of DAC 124 may be source voltage 113. Source voltage 113 may be a DC voltage, square wave, sine wave, or any signal that could be generated by a function generator. The voltage may be as low as zero volts, or as high as 1000V, depending on the lowest resistance of taxels 109 and the requirement of the material being used. DAC 134 may be configured to convert a digital signal generated by controller 122 to an analogue signal based on reference voltage 126. The output of DAC 134 may be a common voltage used by transimpedance amplifiers 112, voltage buffers 114 and row buffers 118.

In some embodiments, the addressing circuit 100 may comprise one or more analogue to digital converters (ADCs) 128 for converting an analogue output of one or more transimpedance amplifiers 112 into a digital input. The digital input may be communicated to the controller 122. The reference voltage used by ADC 128 may be generated by reference DAC 132 based on a signal generated by controller 122, using reference voltage 126. Controller 122 may control the signal output by reference DAC 132 based on sensitivity and noise requirements. While the illustrated embodiment shows ADC 128 as a single component separate to controller 122, according to some embodiments, ADC 128 may be implemented as ADC inputs on controller 122. According to some embodiments, ADC 128 may instead be implemented as a plurality of ADCs connected to a bank of multiplexers, or as a single ADC to which the transimpedance amplifiers 112 multiplex to. According to some embodiments, ADC 128 may instead be implemented as a plurality of ADCs all connected to inputs on controller 122 to be read in parallel without a multiplexer.

Some embodiments of circuit 100 further comprise a field programmable gate array (FPGA) which handles the reading of outputs of ADC 128 and routing of the data in parallel. Some embodiments may comprise a plurality of FPGAs reading the outputs of a plurality of ADCs 128 and routing the data to controller 128 in parallel. This is described in further detail below with reference to FIG. 12.

The addressing circuit 100 may further comprise a filter 130 to filter the output of the transimpedance amplifiers 112, before converting the output into a digital input using the analogue to digital converter 128. According to some embodiments, filter 130 may comprise a plurality of filters, such as one filter for each transimpedance amplifier 112 or each ADC 128, for example.

Referring to FIG. 3, an example impedance addressing circuit 200 in accordance with a further embodiment is shown. The impedance addressing circuit 200 may comprise like elements to the addressing circuit 100 described above. Controller 122 may be configured to perform a discrete Fourier transform or Fast Fourier Transform (FFT) on the signal read from ADC 128 so that both magnitude and phase of the signal can be determined, allowing circuit 200 to determine both resistive and reactive components of each read taxel 109. In addition, the impedance addressing circuit 200 may comprise a system phase demultiplexer 234 configured to calibrate measurement of changes in phase, by bypassing the conductor array 102. Specifically, system phase demultiplexer 234 is configured to calibrate measurement of the system phase of circuit 200, being the phase offset incurred by all components of circuit 200 not in the taxel array 102. According to some embodiments, system phase demultiplexer 234 may be patched in to circuit 200 at system startup for calibration purposes only, and may otherwise be removed.

A precision resistor 236 may be connected between the system phase demultiplexer 234 and the output demultiplexer 116, and system phase demultiplexer 234 may be configured to shunt current through precision resistor 236 instead of through taxel array 102. This allows for a phase offset for each current path to array 102 to be calculated and then offset from a measurement phase for impedance calculation purposes. Precision resistor 236 may be patched in to circuit 200 at system startup for calibration purposes only, to calculate the system phase offset incurred by all components of circuit 200 not in the taxel array 102. After system startup and calibration is complete, taxel array 102 may be patched back in for the rest of the operation and the calculated phase offset may be subtracted from all phase measurements.

The impedance addressing circuit 200 may further comprise a direct digital signal synthesiser 238 configured to provide a signal in the form of a digital domain sinusoid to DAC 124, which converts the signal to an analog signal to drive the selected buffers 118. The system phase may be measured through the precision resistor 236, and changes in phase caused by the conductive array 102 may be determined through a comparison between the actual phase and the measured phase. Advantageously, the impedance addressing circuit 200 may be implemented to measure changes in electrical characteristics at each taxel 109, such as impedance.

Figure 5:
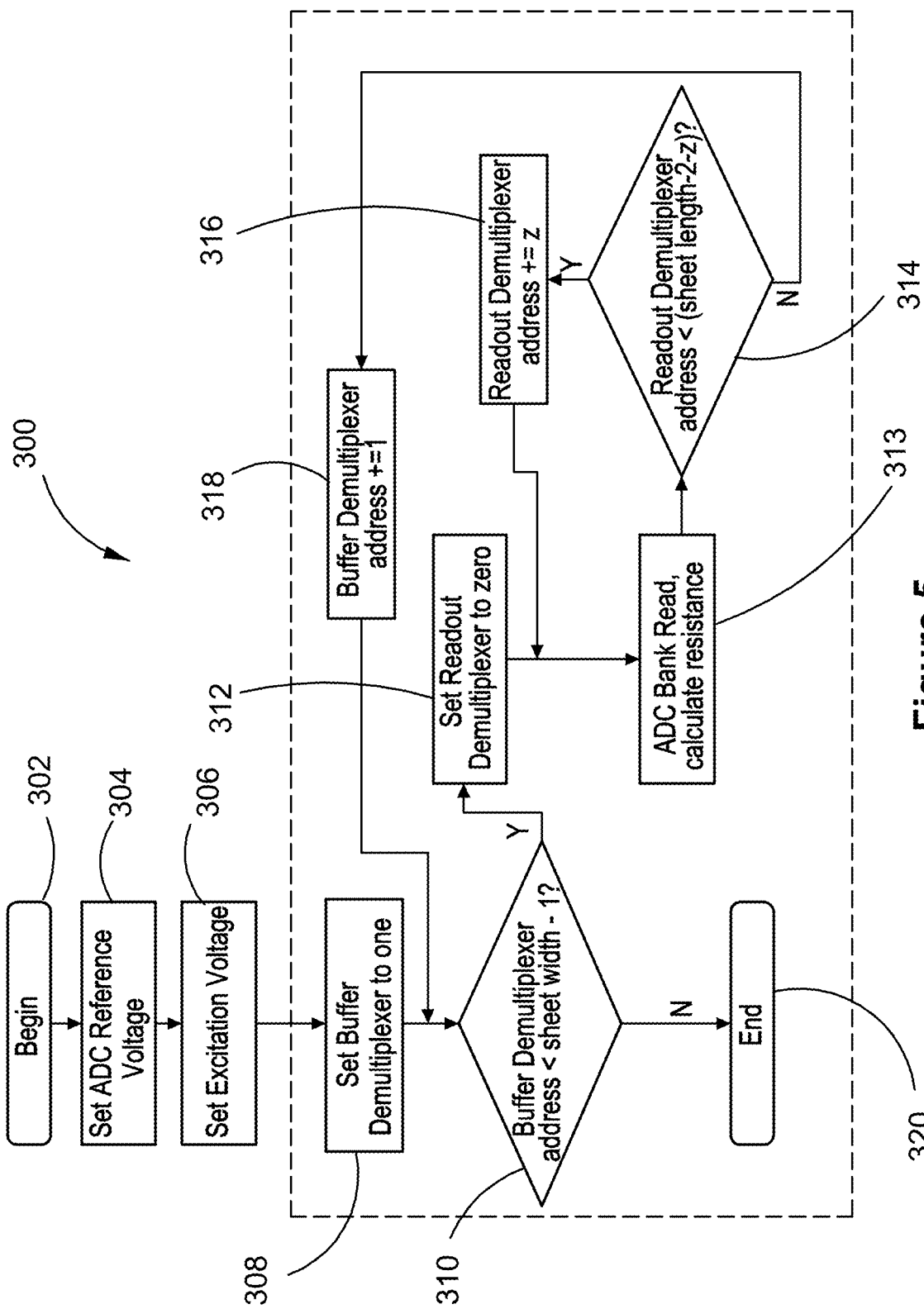
FIG. 5 is a block flow diagram of a measuring algorithm executed for the addressing circuit of FIG. 2.

Referring to FIG. 5, an addressing algorithm 300, which may be implemented by controller 122 for addressing circuit 100, is shown. At step 302 the algorithm is initialized. The analogue to digital reference voltage used by ADC 128 is set at step 304, and the initial excitation voltage output by DAC 124 as source 113 is set at step 306. This may be done by controller 122 outputting control signals to DAC 132 and DAC 124, to control the output of DACs 132 and 124. At step 308 the addressing algorithm sets the address of buffer demultiplexer 120 to one. The address of buffer demultiplexer 120 is also referred to as the row address. In the illustrated embodiment, the address of the first row and the first column is zero, as the first address is determined with respect to the lowermost fence. However, the first and last rows and the first and last columns of array 102 are not measured. This is because these conductors have no other voltage potentials to either side of them, because they are at the edge of the array 102. As a result, their response is different and may not result in a useful measurement. By removing the first and last columns and rows, a characteristic curve can be used to calibrate array 102. If the first and last column and row are to be used, they must be separately calibrated.

The algorithm then enters a loop wherein at step 310 a check is conducted to see if every row 106 has been addressed. In other words, a check is conducted to see if the row address is smaller than the total number of rows 106 in the taxel array 102 (being the sheet width of array 102) minus one. If no, algorithm 300 concludes at step 320. If the row address is smaller than the number of rows 106 minus one, then for each row 106, a test is conducted to determine if every column 108 of array 102 has been read. First, at step 312, the address of readout demultiplexer 116 is set to zero. The address of readout demultiplexer 116 is also referred to as the column address. Then, at step 313, z adjacent columns are measured consecutively via a read of ADC 128, including a calculation of their resistance. The algorithm then enters a second loop wherein at step 314 a check is conducted to see if every column has been addressed. In other words, a check is conducted to see if the column address is smaller than the total number of columns 108 in the taxel array 102 minus two minus z, where z is the number of column conductors being measured per read. If no, at step 318 the row address is incremented by 1, and algorithm 300 continues from step 310.

If the column address is smaller than the number of columns 108 minus two minus z, then at step 313, and the check at 314 are repeated until all of the columns 108 have been read in relation to the selected row 104. Thereafter, as described above, at step 318 the buffer demultiplexer address, or row number, is incremented and at 316, each column 108 is again read with reference to the newly addressed row 106. This process is repeated until each column 108 has been read with reference to each row 106. Algorithm 300 thereby addresses each taxel 109 and measures the electrical characteristics of each taxel 109.

Figure 6:
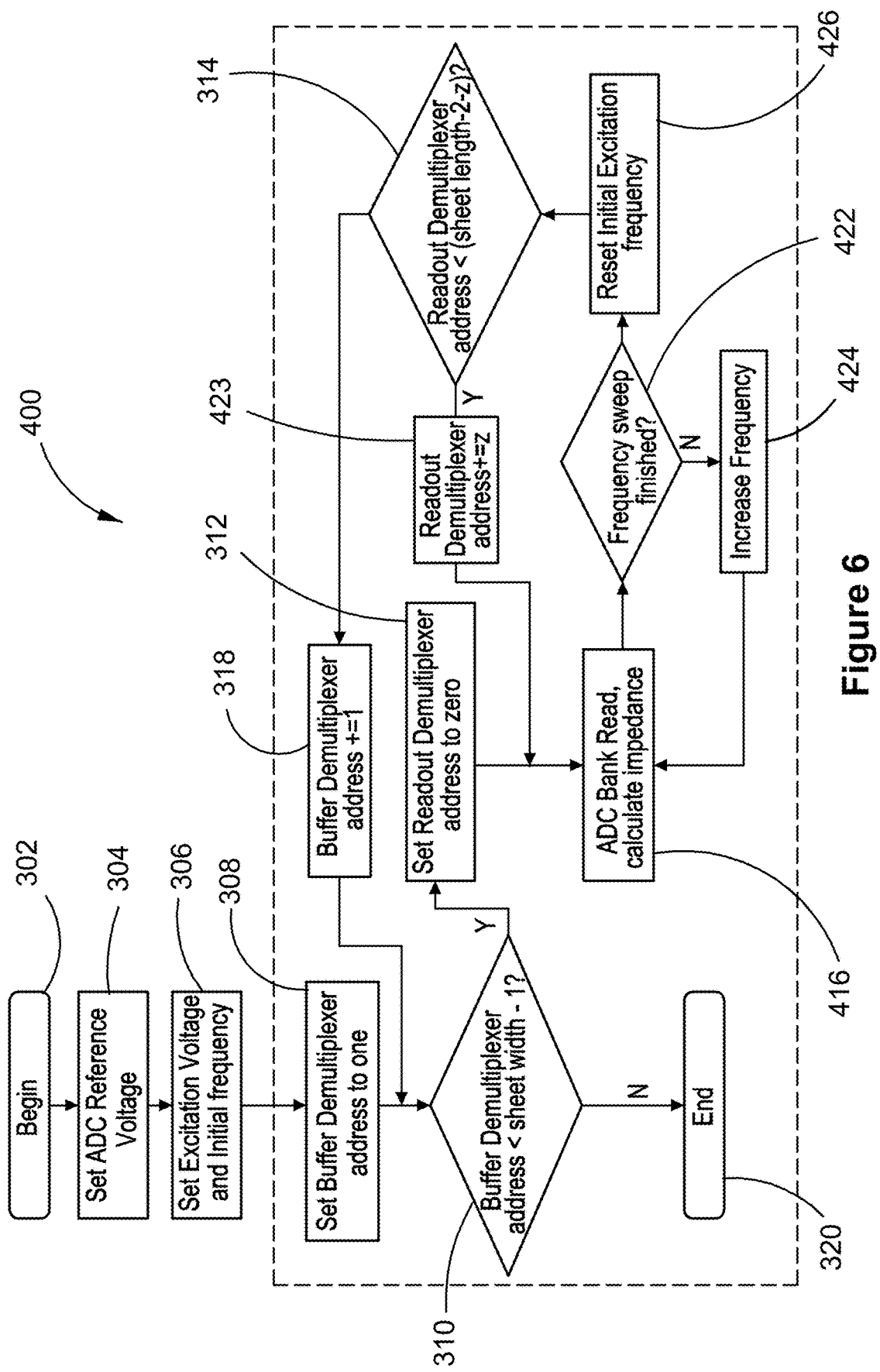
FIG. 6 is a block flow diagram of a measuring algorithm for the addressing circuit shown in FIG. 3.
Figure 7:
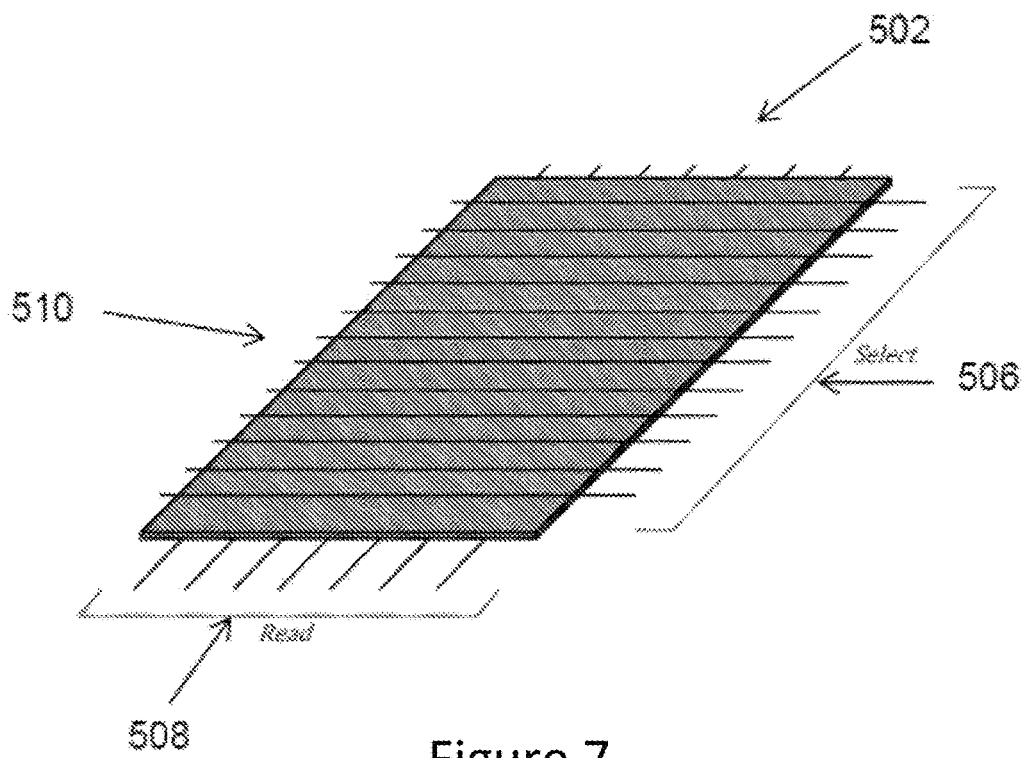
FIG. 7 is a schematic representation of a taxel array in the form of a sheet.

Referring to FIG. 6, an impedance addressing algorithm 400, which may be implemented by controller 122 for impedance addressing circuit 200 is shown. At step 302 the algorithm is initialised by setting the analogue to digital reference voltage used by ADC 128 at step 304. At step 406, the initial excitation voltage output by DAC 124 as source 113 is set, as is the initial frequency of the signal output by DAC 124. This may be done by controller 122 outputting control signals to DAC 132 and DAC 124, to control the output of DACs 132 and 124. At step 308 the addressing algorithm sets the address of buffer demultiplexer 120 to one. The address of buffer demultiplexer 120 is also referred to as the row address.

The algorithm then enters a loop wherein at step 310 a check is conducted to see if every row 106 has been addressed. In other words, a check is conducted to see if the row address is smaller than the total number of rows 106 in the taxel array 102 (being the sheet width of array 102) minus one. If no, algorithm 300 concludes at step 320. If the row address is smaller than the number of rows 106 minus one, then for each row 106, a test is conducted to determine if every column 108 of array 102 has been read. First, at step 312, the address of readout demultiplexer 116 is set to zero. The address of readout demultiplexer 116 is also referred to as the column address. At step 416, z adjacent columns are measured consecutively via a read of ADC 128, including a calculation of their impedance.

The algorithm then enters a second loop wherein at step 422, algorithm 400 performs a frequency sweep to analyse the changes in impedance at each addressed taxel 109 across a predetermined frequency range. For example, the frequency sweep may be conducted at frequencies of between 9 and 11 MHz. If the frequency sweep has not finished, at 424 the frequency of source voltage 113 is increased or decreased by direct digital signal synthesiser 238 based on a command from controller 122 or based on a routine built in to direct digital signal synthesiser 238. The frequency may be increased or decreased by a predetermined step size, depending on whether the frequency sweep is being performed upwards or downwards. For example, according to some embodiments, the frequency sweep may be being performed upwards from 9 MHz to 11 MHz, and the step size may be 0.5 MHz, so the frequency sweep may start at a frequency of 9 MHz, and at step 424 the frequency may be increased by 0.5 Mhz. The selected columns 101 connected to the transimpedance amplifiers 112 are again read at step 416, and checked to identify changes in impedance at 422. Once the frequency sweep has finished at step 422, the initial excitation frequency is reset at step 426. The frequency sweep may be determined to be finished once the upper or lower limit of the predetermined frequency range has been reached, depending on whether the frequency sweep is being performed upwards or downwards. For example, where the frequency sweep is being performed upwards from 9 MHz to 11 MHz, and the step size is 0.5 MHz, the frequency sweep may be determined to be finished once the frequency reaches 11 MHz.

Next, at step 314, a check is conducted to see if every column 108 has been addressed. In other words, a check is conducted to see if the column address is smaller than the total number of columns 108 in the taxel array 102 minus two minus z, where z is the number of column conductors 108 being measured per read. If no, at step 318 the row address is incremented by 1, and algorithm 300 continues from step 310. If the column address is smaller than the number of columns 108 minus two minus z, then the readout demultiplexer address is incremented by z at step 423, and the method continues from step 416. Steps 416, 422, 424, 426 and 314 are then repeated until all of the columns 108 have been read in relation to the selected row 104. Thereafter, as described above, at step 318 the buffer demultiplexer address, or row number, is incremented and at 416, each column 108 is again read with reference to the newly addressed row 106. This process is repeated until each column 108 has been read with reference to each row 106. Algorithm 400 thereby addresses each taxel 109 and measures the electrical characteristics of each taxel 109.

Referring to FIGS. 7 to 10, a system for detecting pressure injury formation 500 is shown. As shown for example in FIG. 7, the system 500 comprises a taxel array 102 in the form of a sheet 502 comprising rows 506 and columns 508 of conductors arranged on opposing sides of a conductive material 510, forming a sensing array comprising a matrix of variable impedances. According to some embodiments, conductive material 510 may be a sheet made of media that changes its electrical characteristics in response to stimuli.

A taxel 109 is formed at the intersection of each row 106 with each column 108, and each taxel 109 is analysed by determining changes in electrical characteristics, at the intersection between rows 106 and columns 108 as per the methods described above with reference to FIGS. 5 and 6. The conductive material 510 may, for instance, comprise a piezo-resistive, or piezoelectric material and may comprise any material having a measurable electrical property which changes with application of energy, which may be pressure in some embodiments. The conductor array may be arranged on or within the sheet of piezo resistive material. The conductive material 510 may be a continuous sheet of material.

According to some embodiments, sheet 502 may be sized and shaped to be used as a bedsheet, article of clothing, furniture cover, rug, insole, or other product. For example, sheet 502 may be developed to be of a size and shape suited to being used as an insole within a shoe, to allow pressure measurements within the shoe to be measured, allowing for a gait assessment to be performed. Where sheet 502 is applied to a seat in a vehicle such as a car or aeroplane, pressure points can be monitored to allow for alerts to be issued where a pressure induced injury is likely for a passenger occupying the seat. Where sheet 502 is being used as a bedsheet, sheet 502 may be of a rectangular shape and may be around 127 cm by 224 cm in size. According to some embodiments, rather than a flat sheet, array 102 may be applied to another shape or product, such as a sphere, aerofoil, chair, or other product.

Illustrated sheet 502 has column conductors 108 running perpendicular to row conductors 106. Each row conductor 106 is parallel to each other row conductor 106, and each column conductor 108 is parallel to each other column conductor 108. However, other arrangements are also possible. For example, column conductors 108 may be positioned at an angle other than 90° with respect to row conductors 106. Furthermore, illustrated sheet 502 shows column conductors 108 positioned on an opposed side of conductive material 510 to row conductors 106. In some embodiments, column conductors 108 may be positioned on the same side of conductive material 510 as row conductors 106. In such an embodiment, dielectrics may be placed at the intersections of column conductors 108 and row conductors 106 to prevent electrical contact between column conductors 108 and row conductors 106.

Conductors 106 and 108 may be positioned at equal distances apart from one another, or the spacing of conductors 106 and 108 may vary across the sheet 502. According to some embodiments, conductors 106 and 108 may be spaced at between 0.1 cm and 10 cm apart, for example. According to some embodiments, conductors 106 and 108 may be spaced 1 cm, 1.4 cm, 2 cm, or 3 cm apart, for example. According to some embodiments, the minimum spacing between conductors may be calculated based on the resistance of the surface of the conductive material 510. The larger the distance between conductors, the larger the resistance between them.

According to some embodiments, the spacing of row conductors 106 may be the same as the spacing of column conductors 108. According to some embodiments, row conductors 106 may be spaced sparser or more densely than column conductors 108. According to some embodiments, the spacing of conductors 106 and/or 108 may be denser in areas requiring a higher sensitivity of sensor information, such as areas of a sheet that would correspond to a patients head, shoulders, sacrum and feet, for example.

Figure 8:
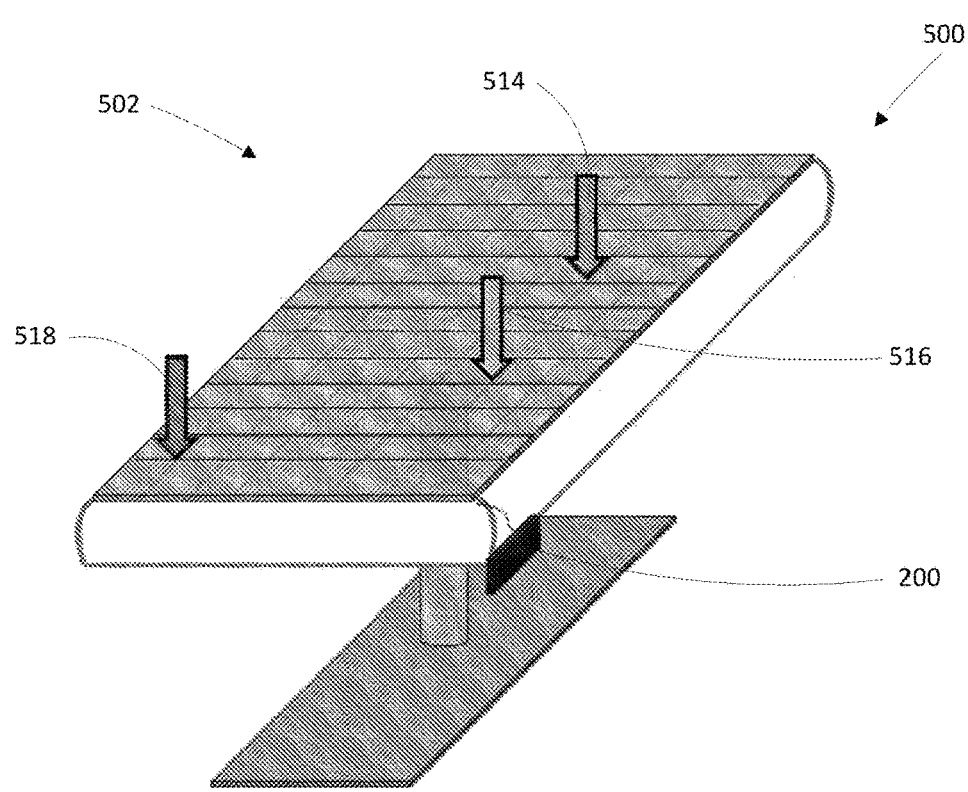
FIG. 8 is a schematic representation of a system for preventing pressure injuries in accordance with some alternative embodiments.
Figure 10:
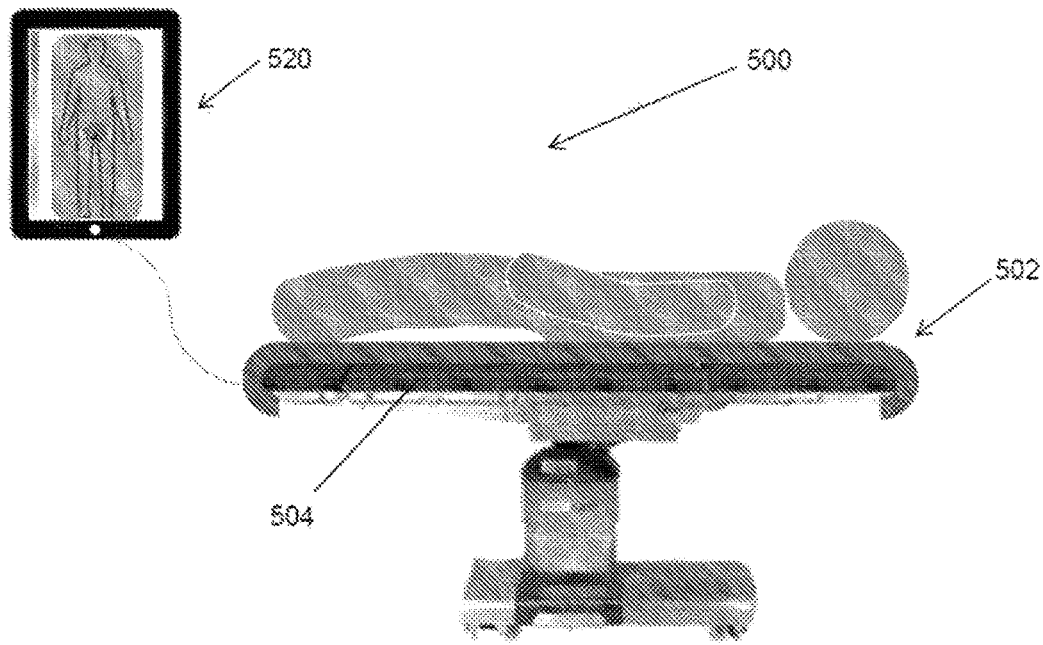
FIG. 10 is a schematic representation of a system for preventing pressure injuries with a patient positioned the sheet.

As shown in FIG. 8, for example, the sheet 502 may be fitted over an operating table 504. As shown in FIG. 10, sheet 502 may be positioned between a patient and the table 504. Referring to FIG. 8, the system 500 comprises impedance addressing circuit 200 to analyse changes in electrical characteristics of taxels 109 defined on the fitted sheet 502. For example, the sheet 502 has light 514, moderate 516, and severe 518 forces applied to sections of the sheet 502.

Figure 9:
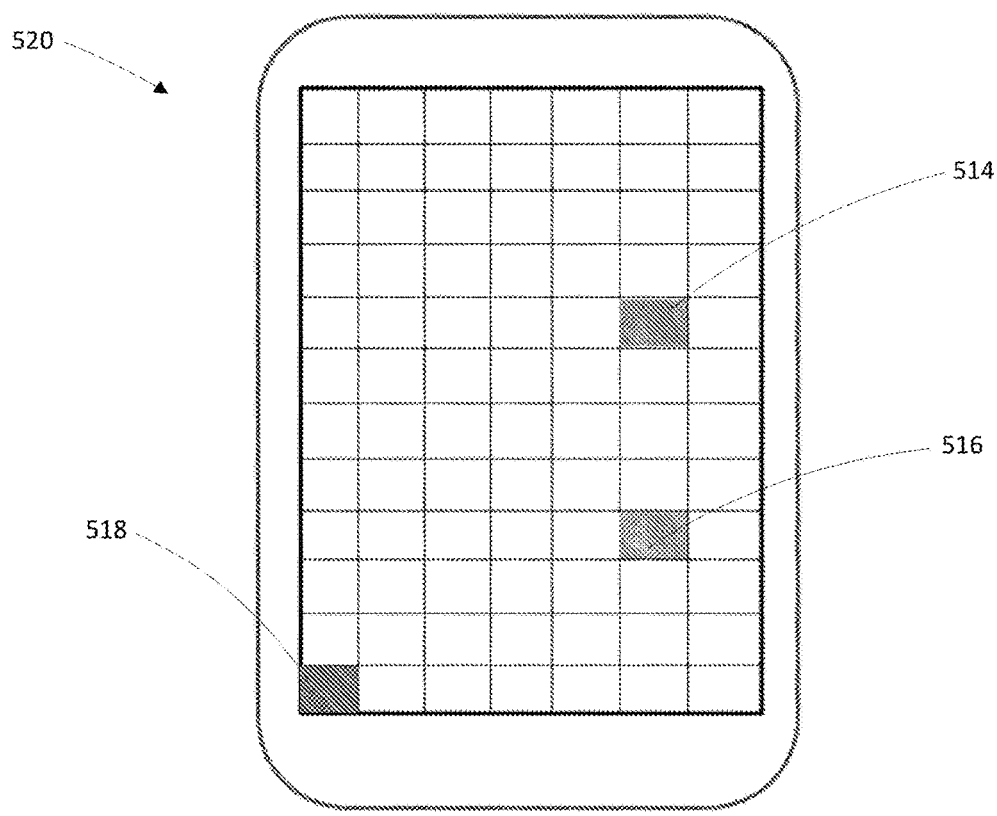
FIG. 9 is a schematic representation of a display connected to the system of FIG. 8.

As shown, for example, in FIGS. 9 and 10, the system 500 may comprise a display 520 to graphically represent forces applied to the sheet 502. The display may, for instance, reflect the severity and location of a force applied to the sheet by representing the forces on the display 520. Light force 514 may be indicated in green, moderate force 516, may be indicated in violet, and severe force 518 may be indicated in red. A further indicator, such as, for instance, flashing may be used to indicate that a pressure injury is likely to occur and that action is required to prevent a pressure injury from forming. This may be determined based on the duration and intensity of pressure sensed at a location on sheet 502.

Figure 11A:
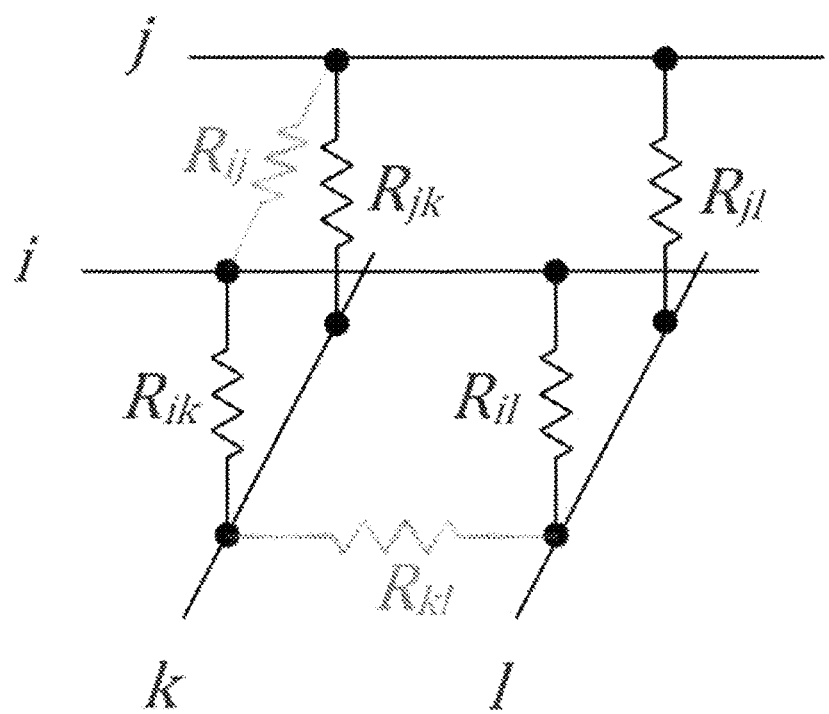
FIG. 11A is a detailed view of the conductor array of FIG. 1.
Figure 11B:
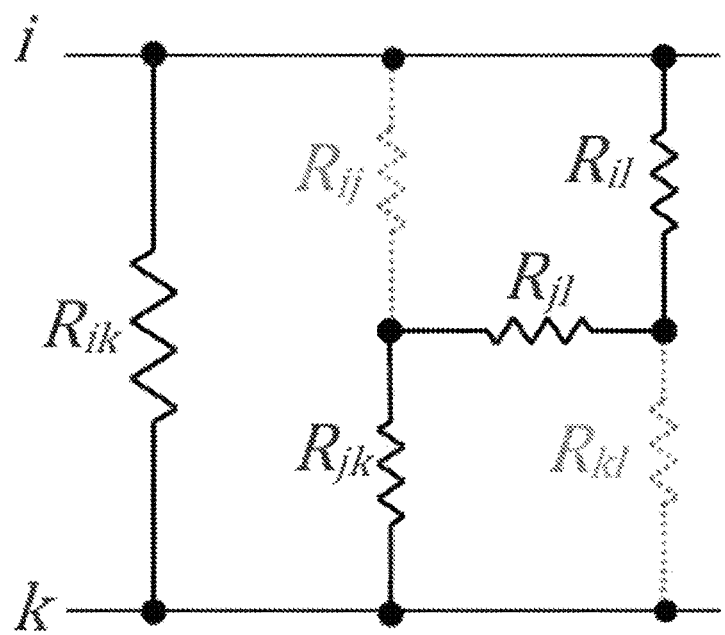
FIG. 11B is a view of a selection of components of FIG. 11A.

FIGS. 11A and 11B show a detailed view of a portion of taxel array 102, showing the unwanted interference that may corrupt measurements of the electrical characteristic of taxels 109. Specifically, FIG. 11A shows rows j and i and columns k and I in detail, where row i is excited by connection to voltage source 113, and a measurement is being taken at column k. The desired measurement is that of resistor $R_{ik}$. However, as row i is excited, backtalk is created in the series combination of resistances $R_{ij}$, $R_{ij}$ 1 and $R_jk$. These appear in parallel to the $R_{jk}$, corrupting the measurement of this resistance. Furthermore, crosstalk appears as the resistance across the surface of the sheet between the selected rows and columns, being resistances $R_{ij}$, and $R_{ik}$. FIG. 11B shows both the backtalk and crosstalk resistances as seen from $R_{ik}$. As described above, addressing circuit 100/200 ameliorates the problems caused by the backtalk and crosstalk resistances.

Figure 12:
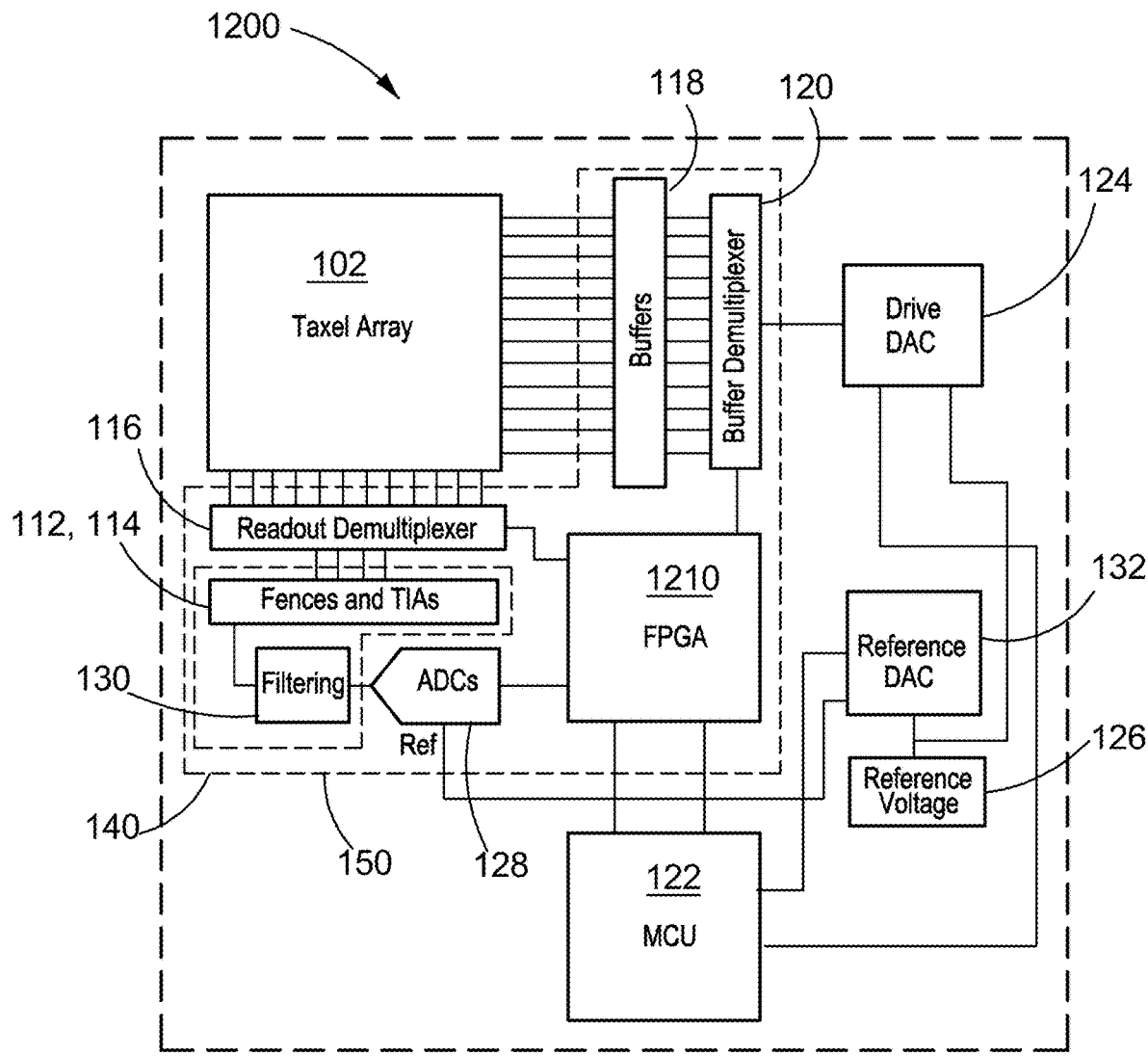
FIG. 12 is a block diagram representation an addressing circuit for a conductor array in accordance with some further embodiments.

FIG. 12 shows an alternative addressing circuit 1200. Circuit 1200 is largely similar to addressing circuit 100 as described above with reference to FIGS. 1 and 2, having a taxel array 102, with buffers 118 selectively addressing rows of array 102 based on buffer demultiplexer 120, and readout demultiplexer 116 selectively connecting fences 114 and transimpedance amplifiers 112 to the selectively addressed columns of array 102. Circuit 1200 further comprises filtering 130, an ADC 128, DACs 124 and 132, as well as a reference voltage 126. However, circuit 1200 further includes FPGA 1210, which is configured to perform functions similar to those performed by controller 122 in circuit 100. FPGA 1210 may be configured to read ADC 128 and communicate with controller 122 to send data to random access memory (RAM) via direct memory access (DMA) channels. Using FPGA 1210 may be advantageous where high speed and parallelization is required, as controller 122 may not be able to provide this on its own. Specifically, FPGA 1210 may be used where ADC 128 is implemented as multiple ADCs on one or more serial parallel interfaces (SPIs).

Figure 13:
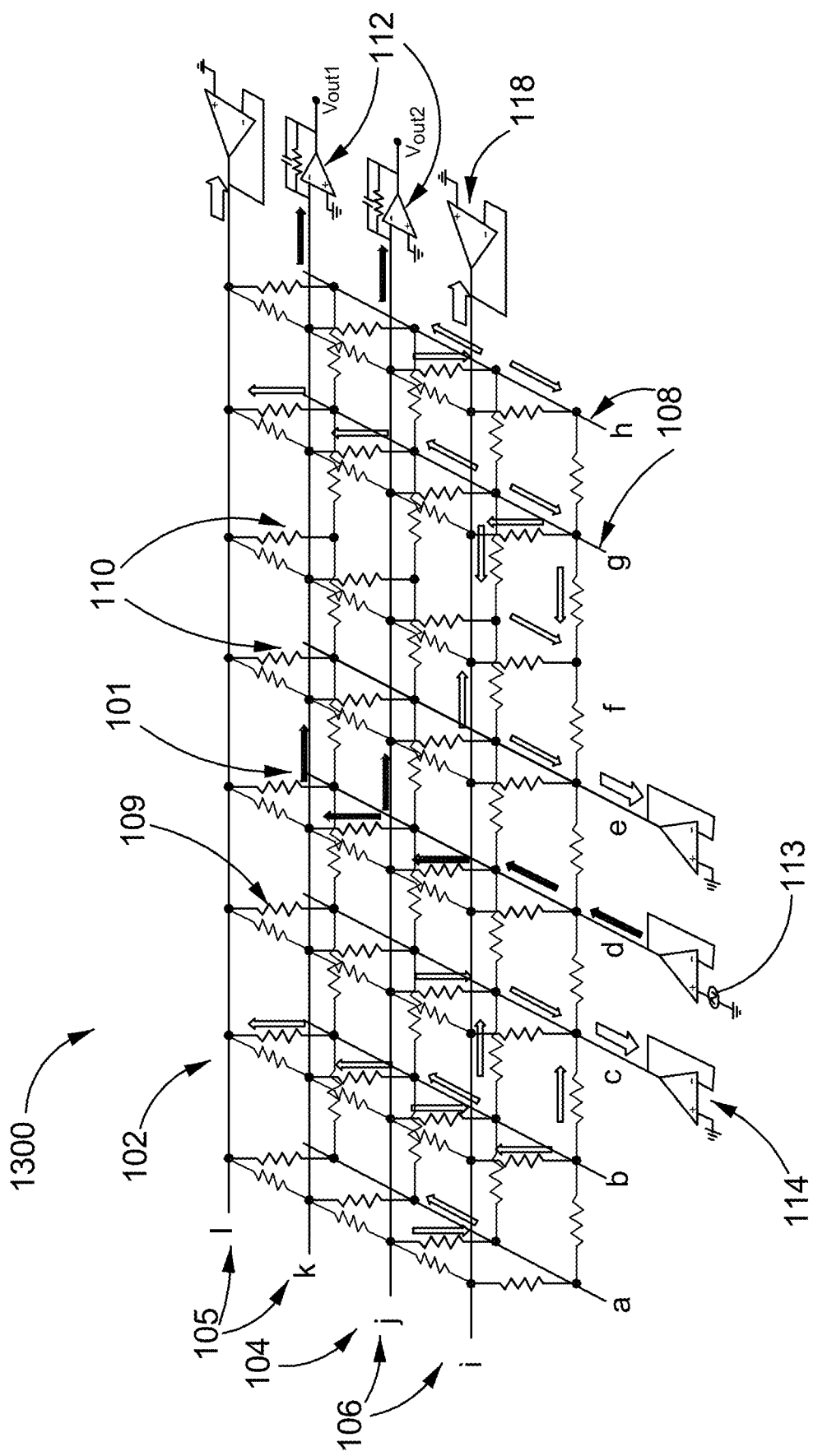
FIG. 13 is a schematic representation of a conductor array connected to elements of an addressing circuit in accordance with some further embodiments.

FIG. 13 shows a further alternative addressing circuit 1300. Circuit 1300 comprises a taxel array 102 having column conductors 108 and row conductors 106, similar to circuits 100 and 200. Furthermore, circuit 1300 has unselected rows 105 and unselected columns 110, with row buffers 118 being connected to each unselected row 105 and voltage buffers 114 being connected to unselected columns 110 on either side of a selected column 101. However, unlike circuits 100 or 200, circuit 1300 comprises transimpedance amplifiers 112 connected to one or more selected rows 104, and a voltage source 113 coupled to a single selected column 101. In this case, transimpedance amplifiers 112 need not be adjacent, but can be connected to any desired columns 106. In the illustrated embodiment, rows k and j are selected rows 104 connected to transimpedance amplifiers 112, while column d is selected column 101 connected to voltage source 113. Unselected columns c and e on either side of column d are connected to voltage buffers 114, while unselected rows i and I are each connected to row buffers 118.

While embodiments have been described in the context of a pressure sensing taxel array, it will be appreciated that the invention can be implemented for any and all types of conductor arrays and is not limited to the applications described herein.

Embodiments provide an addressing circuit for a conductor array that are both generally and specifically useful for replacing traditional addressing circuits, with one of many possible applications being in monitoring conductive arrays used for pressure sensing.

Figure 15:
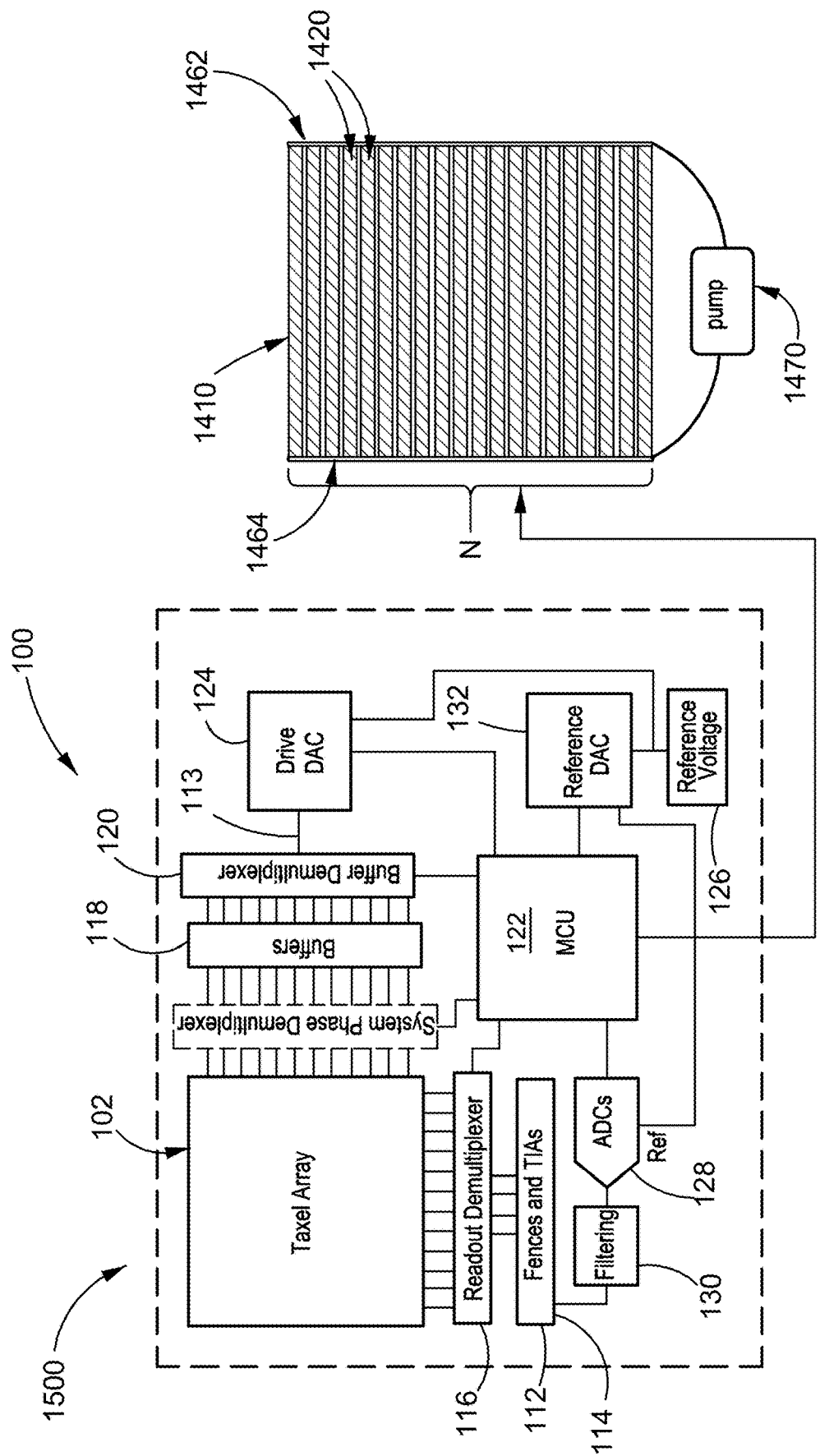
FIG. 15 is a diagrammatic representation of a system for controlling an airbed according to some embodiments.

A specific application of an addressing circuit 100/200/1200/1300 used for pressure sensing is described in further detail below with reference to FIGS. 15 and 16. FIGS. 15 and 16 relate to a method and system of dynamically operating an air mattress based on output produced by an addressing circuit 100/200/1200/1300, to relieve pressure in areas that have been identified as at risk of causing a pressure injury to a patient occupying the air mattress.

Figure 14:
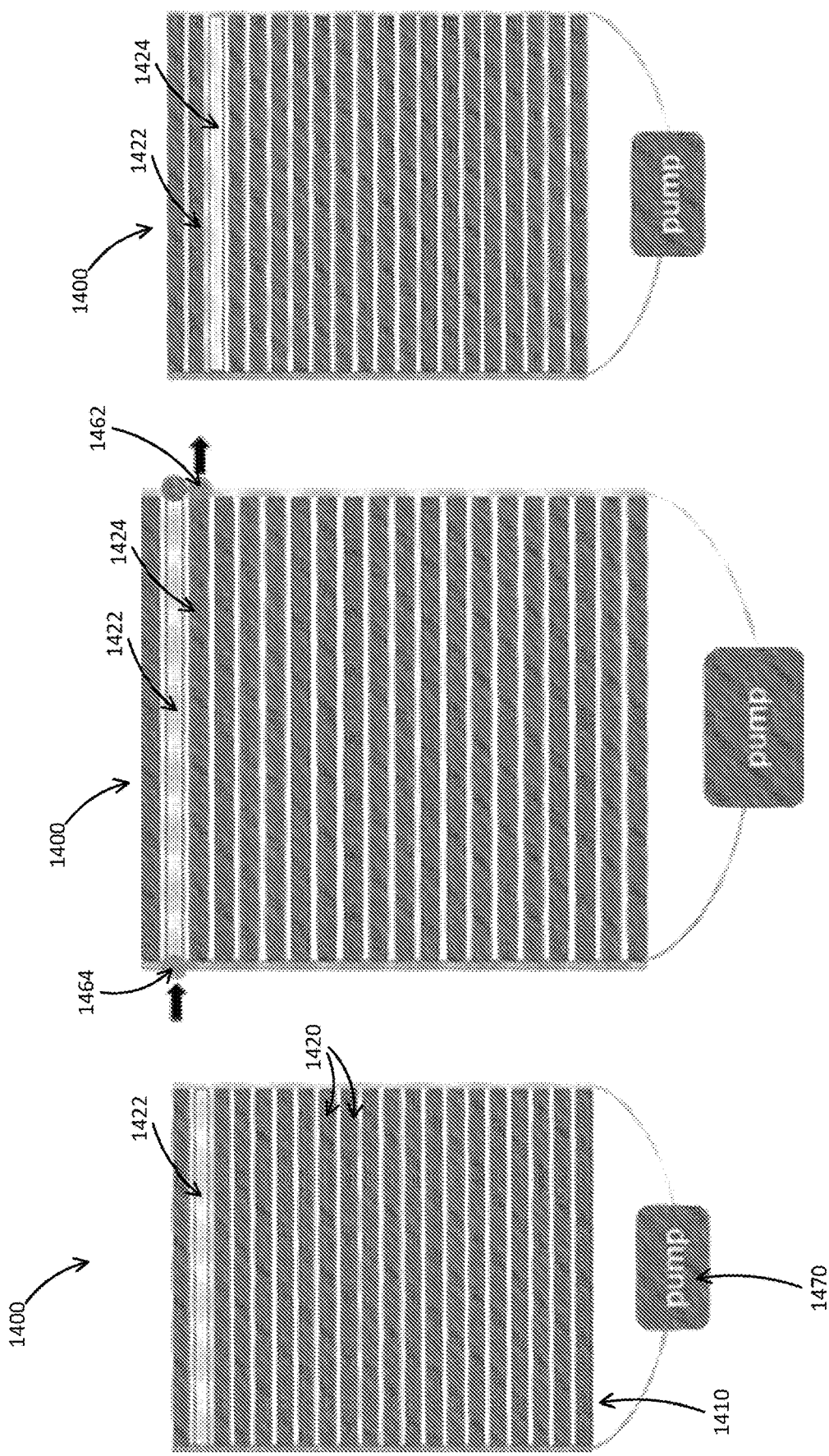
FIG. 14 is a diagrammatic representation of a previously known method for controlling an airbed.

FIG. 14 shows a previously performed method of controlling pressure within air-cells of an air mattress, being a method 1400 of cyclically controlling pressure in air-cells 1420 of an air mattress 1410. Air mattress 1410 comprises a plurality of air-cells 1420 spanning the length of the mattress, with the pressure within each air-cell 1420 controlled by one-way valves 1460. Valves 1460 operate on a timer, such that every timer cycle, an outlet valve 1462 opens to deflate an air-cell 1420, while an inlet valve 1464 is opened to inflate an adjacent air-cell 1420 using pump 1470. For example, at step 1440, an air-cell 1422 is deflated. At step 1445, air-cell 1442 is inflated by valve 1464, while an adjacent air-cell 1424 is deflated via valve 1462. At step 1450, air-cell 1422 has been inflated, while air-cell 1424 is now deflated. Some alternative methods of controlling pressure within air-cells may use pressure sensors on each air-cell, maintaining and redistributing levels of air pressure so that each air-cell is at an equal pressure.

FIG. 15 shows a system 1500 that allows for dynamic control of air pressure within air-cells 1420 of an air mattress 1410, using a taxel array 102 to sense pressure placed on areas of air mattress 1410. Unlike previous systems, system 1500 is adaptive to the specific pressure profile being sensed, allowing for pressure to be increased and decreased throughout air-cells 1420 as required to provide targeted pressure relief. Some air-cells 1420 may be adjusted to have a higher or lower pressure than other air cells 1420. System 1500 comprises an addressing circuit 100 as described above with reference to FIG. 2. According to some embodiments, addressing circuit 200, 1200 or 1300 may alternatively be used, or an addressing circuit that combines the features of one or more of circuits 100, 200, 1200 and 1300 may be used. Controller 122 of addressing circuit 100 communicates with valves 1460 and pump 1470, causing air-cells 1420 to be inflated and deflated as desired. By integrating addressing system 100 with air mattress 1410, each air-cell 1420 can be correlated with a range of taxels 109 corresponding to the grid of taxel array 102. According to some embodiments, mattress 1410 may have air-cells 1420 that span one or both of the x and y axis.

Figures 16A, 16B, 16C:
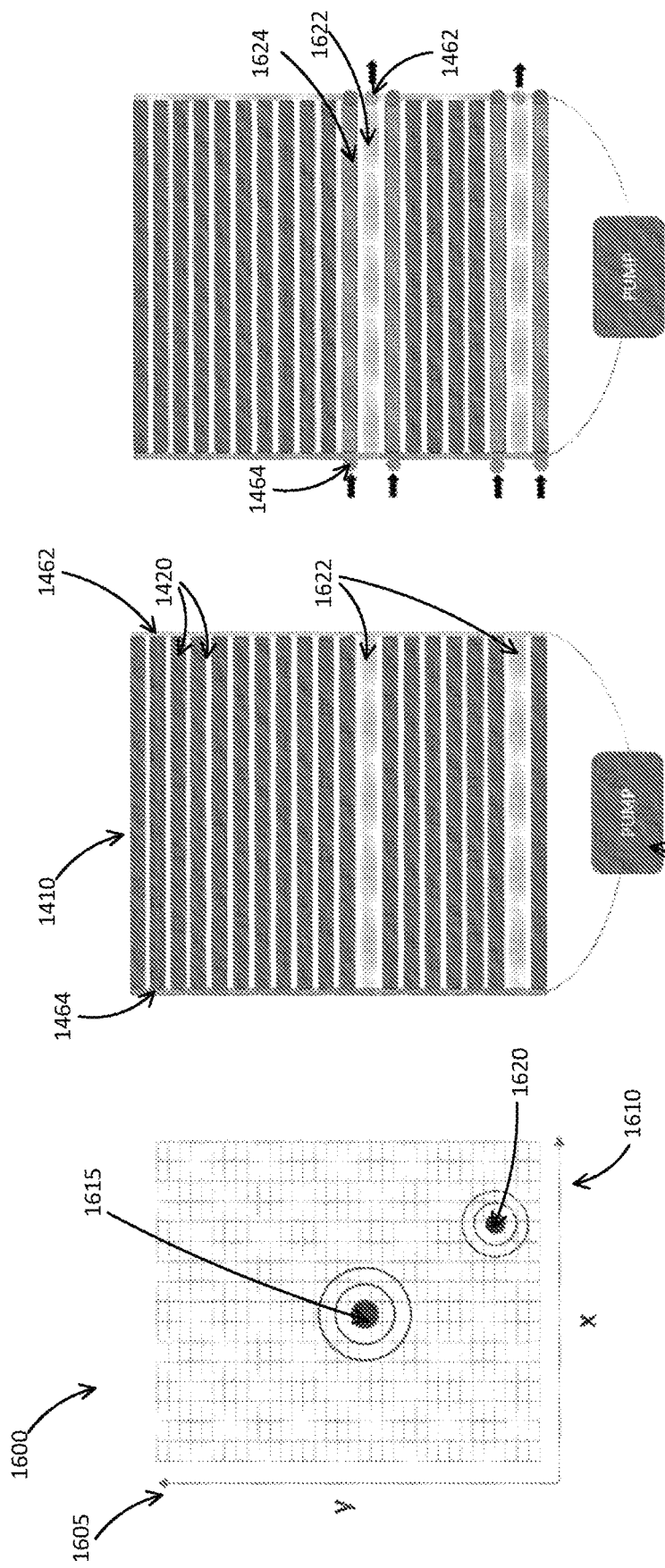
FIGS. 16A, 16B and 16C show a diagrammatic representation of a method for controlling an airbed according to some embodiments.

An example of operation of system 1500 is shown in FIGS. 16A to 16C. FIG. 16A shows an example pressure map 1600 generated by controller 122 based on output received from taxel array 102 located on air mattress 1410. Pressure map 1600 has an x axis 1610 correlating to column conductors 108 of taxel array 102, and a y axis 1605 correlating to row conductors 106 of taxel array 102. A first zone of risk 1615 and a second zone or risk 1620 are shown as circles on pressure map 1600. Zones of risk 1615 and 1620 may have been determined by controller 122 based on a level of pressure sensed by taxels 109 in those zones, a duration of time for which the pressure levels were sensed, pressure gradients, and other risk factors such as Braden scores, Norton scores, Waterlow scores, diabetic status, smoker status, age, BMI and other co-morbidities of the patient. Controller 122 may identify zones of risk and correlate these with an x, y position of the zone within taxel array 102, such as by producing pressure map 1600. Controller 122 may then determine which air-cells 1420 correlate with the x,y positions of the zones of risk. This may be done through application programming interface (API) integration between controller 122 and air mattress 1410. Controller 122 can then determine which air-cells 1420 should be inflated and/or deflated, and send corresponding instruction signals to valves 1462 and 1464, and to pump 1470.

FIG. 16B shows an example air mattress 1410 corresponding to pressure map 1600. Air-cells 1622 correspond to zones of risk 1615 and 1620. Controller 122 may therefore determine that the air pressure within air-cells 1622 should be decreased, to avoid a pressure injury forming on the patient occupying air mattress 1410. FIG. 16C shows an example correction operation being performed by valves 1462 and 1464, and pump 1470, based on control signals received from controller 122. Specifically, output valves 1462 of air-cells 1622 are opened to allow air-cells 1622 to deflate, reducing the pressure on zones of risk 1615 and 1620. Input values 1464 of air-cells 1624 adjacent to cells 1622 are also opened, to allow inflation of cells 1624, to alleviate the pressure produced by cells 1622.

Figure 17:
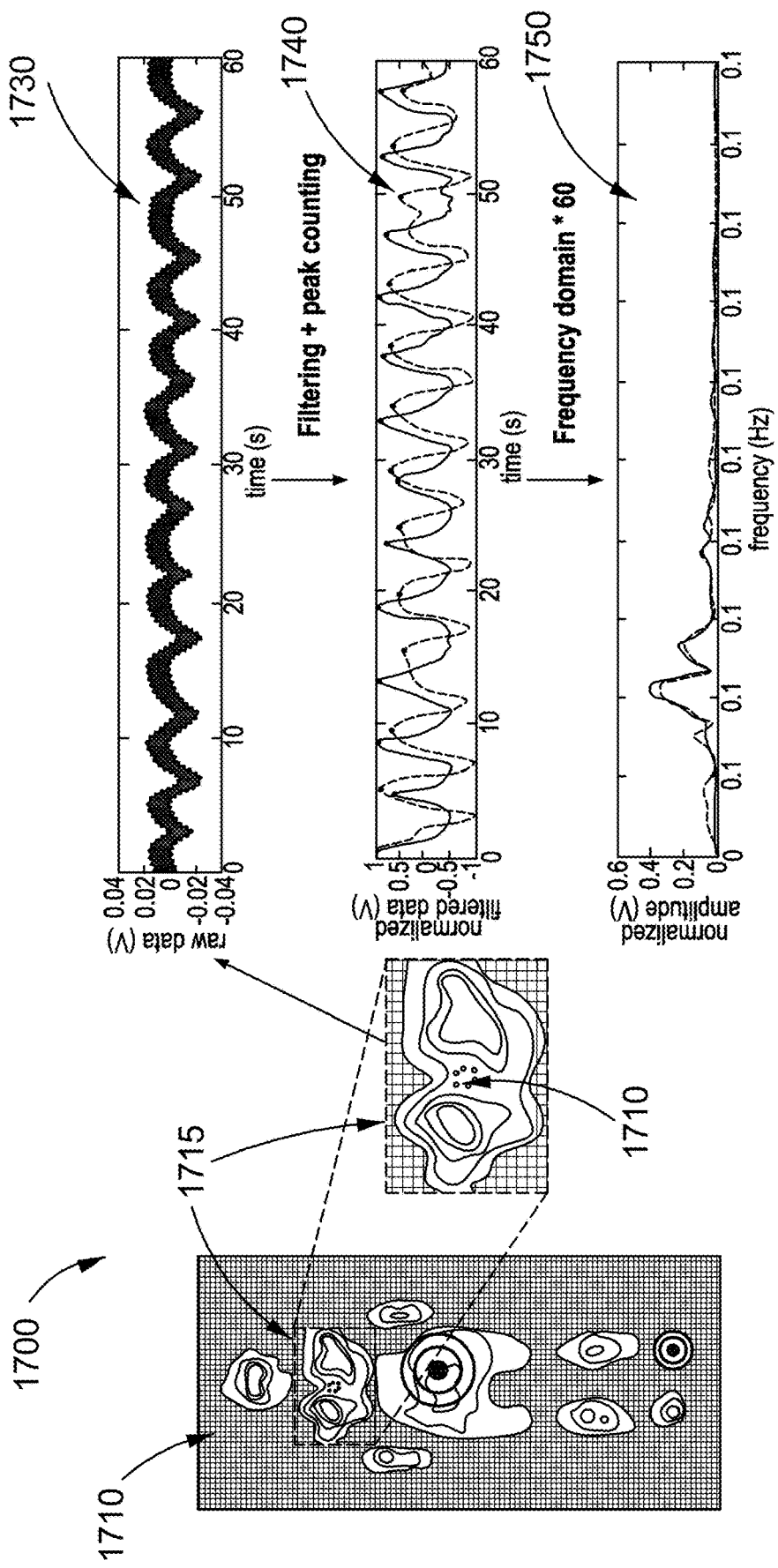
FIG. 17 is a diagrammatic representation of a method for measuring vital signs of a patient according to some embodiments.

A further application of addressing circuits 100/200/1200/1300 is to measure patient vital signs, such as respiratory rate and heart rate, as shown in FIG. 17. FIG. 17 illustrated a method 1700 for extracting vital signs from pressure data generated by taxel array 102. Pressure map 1710 illustrated the levels of pressure being sensed by a taxel array 102. By using an image recognition algorithm, a chest cavity area 1715 of the pressure map 1710 can be identified. A midpoint 1720 of the chest cavity area 1715 is identified, and pressure data for midpoint 1720 is extracted for a given time period, as shown by signal 1730. Raw signal data 1730 is filtered within specific cut-off frequencies based on known physiological boundaries of vital signs. For example, the signal may be filtered within 0.16 Hz to 0.66 Hz for determining a respiratory rate which tends to be between 10 and 40 breaths per minute, or to between 0.83 Hz and 2.5 Hz for heart rate, which tends to be between 50 and 150 beats per minute. The recorded and filtered data can be analysed in both the time domain and the frequency domain. In the time domain, moving windows which may be around 1 minute in duration can be extracted and the number of peaks in that time period can be counted, to determine values for heart rate and respiratory rate, as shown by signal 1740. In the frequency domain, the frequency with the highest peak can be identified and multiplied by 60 to determine values for heart rate and respiratory rate, as shown by signal 1750.

Addressing circuits 100/200/1200/1300 may further be used to determine whether a patient is in or out of bed. This may be done by determining whether taxel array 102 senses an arbitrary weight, such as at least 10 kg. The weight sensed may be determined based on the pressure values recorded by each taxel and the number of taxels or area covered by taxels sensing a pressure.

Figure 18:
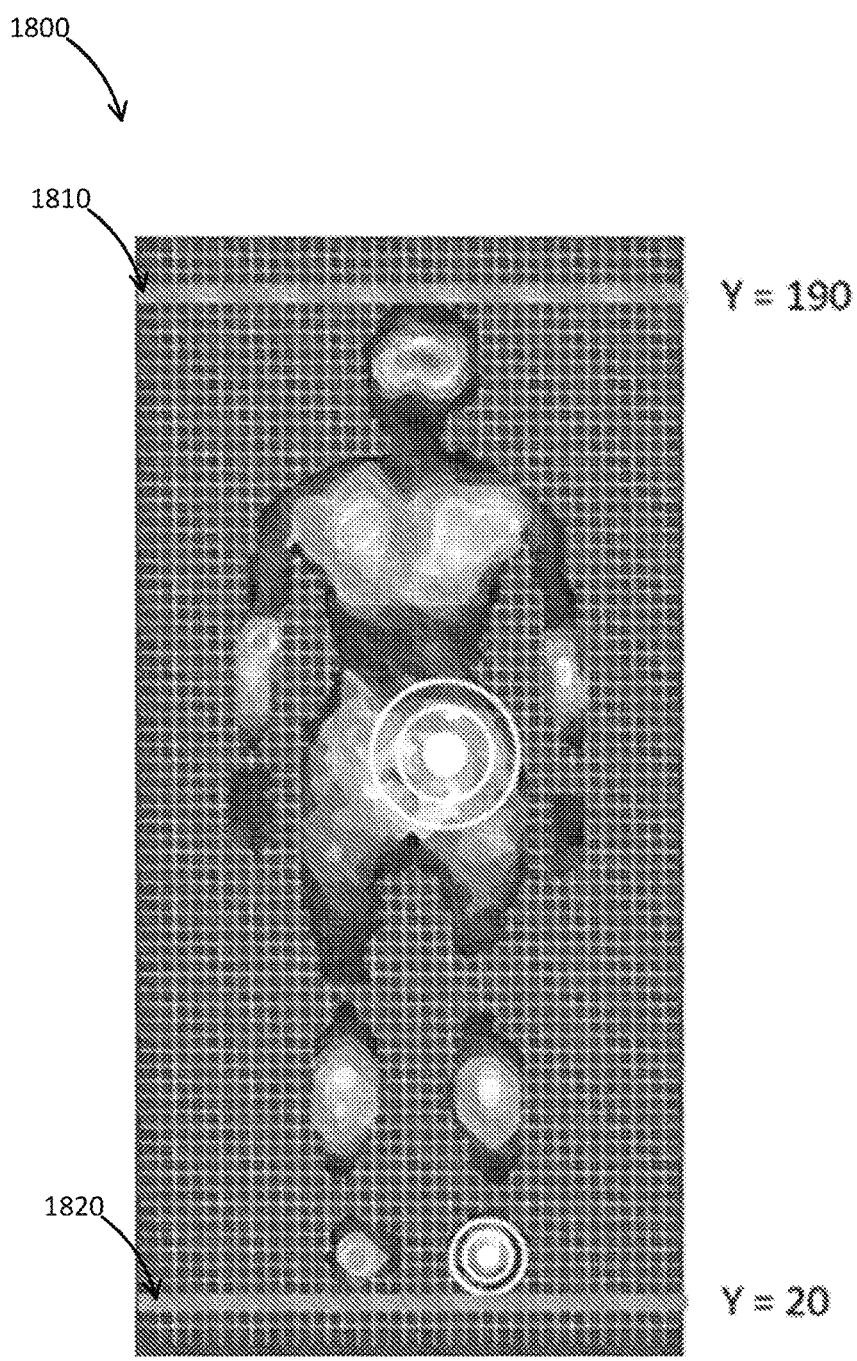
FIG. 18 is a diagrammatic representation of a method for measuring a height of a patient according to some embodiments.

Addressing circuits 100/200/1200/1300 may also be used to determine a patient height while the patient is lying supine on taxel array 102. This may be done by identifying the upper and lower bounds of pressure readings on the taxel array 102, subtracting the lower bound from the upper bound, and multiplying the result by the set unit spacing between taxels 109 in array 102. For example, in the pressure map 1800 shown in FIG. 18, upper bound 1810 has been measured as 190, while lower bound 1820 has been measured as 20. The difference between the upper and lower bound is 170. Assuming the spacing between taxels 109 is 1 cm, the height of the patient can therefore be determined to be 170 cm.

Figure 19:
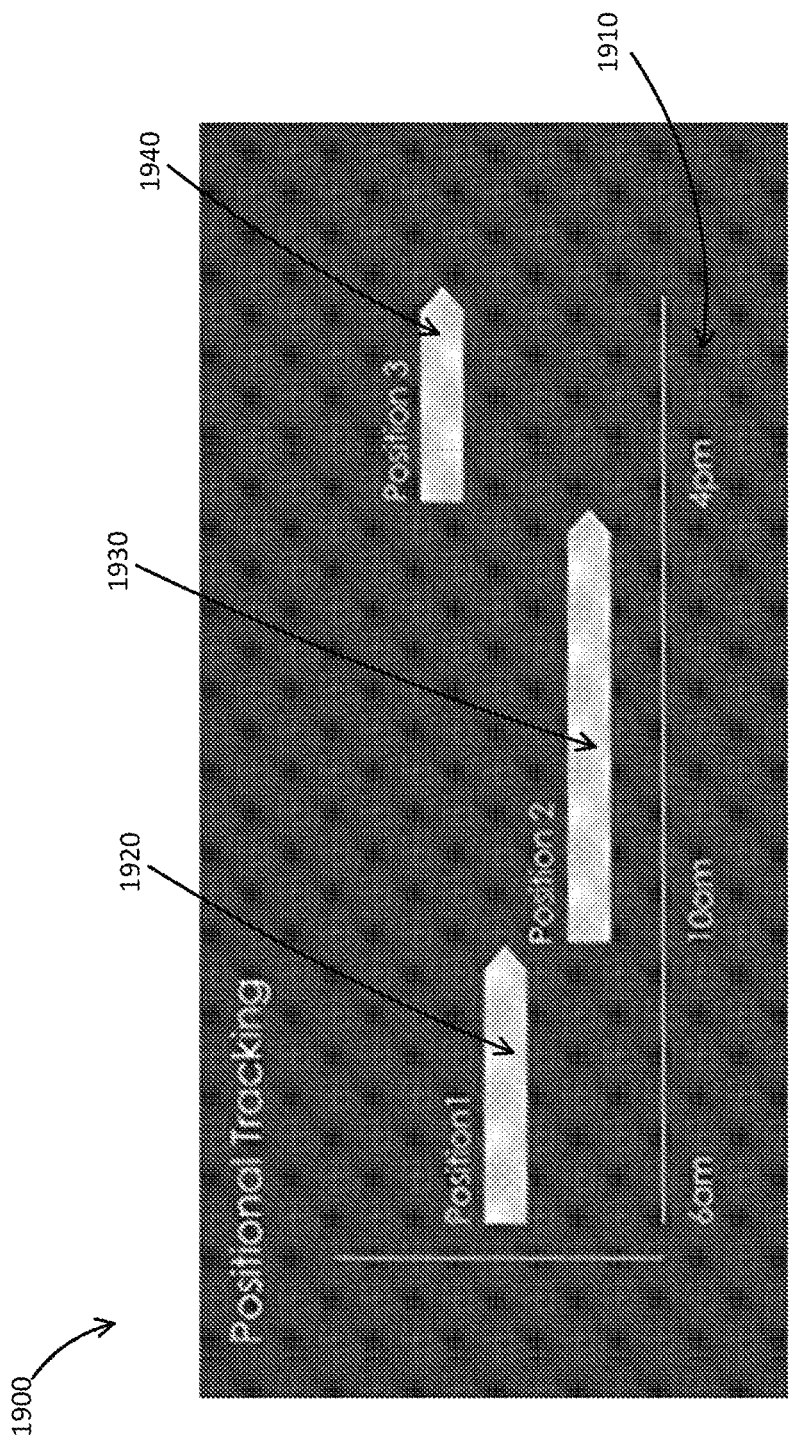
FIG. 19 is a diagrammatic representation of a method for tracking movement of a patient according to some embodiments.

A further application of addressing circuit 100/200/1200/1300 is as a position or movement tracking tool. Movement tracking involves recording a history of the pressure profile as generated by taxel array 102. A snapshot of the pressure profile may be taken periodically, which can be used to determine the history of pressure over a set period of time to allow for the positions adopted by the patient or the frequency of movement of the patient to be determined. This can be used to monitor restlessness in bed, sleep activity, and other characteristics. A graphical representation of the positions adopted by a patient may be generated by using image recognition of a pressure map image generated based on the pressure measurement data. An example of such a graphical representation 1900 is shown in FIG. 19, with an x-axis 1910 showing the time, and bars 1920, 1930 and 1940 corresponding to particular positions adopted by the patient over the time period.

Figure 20:
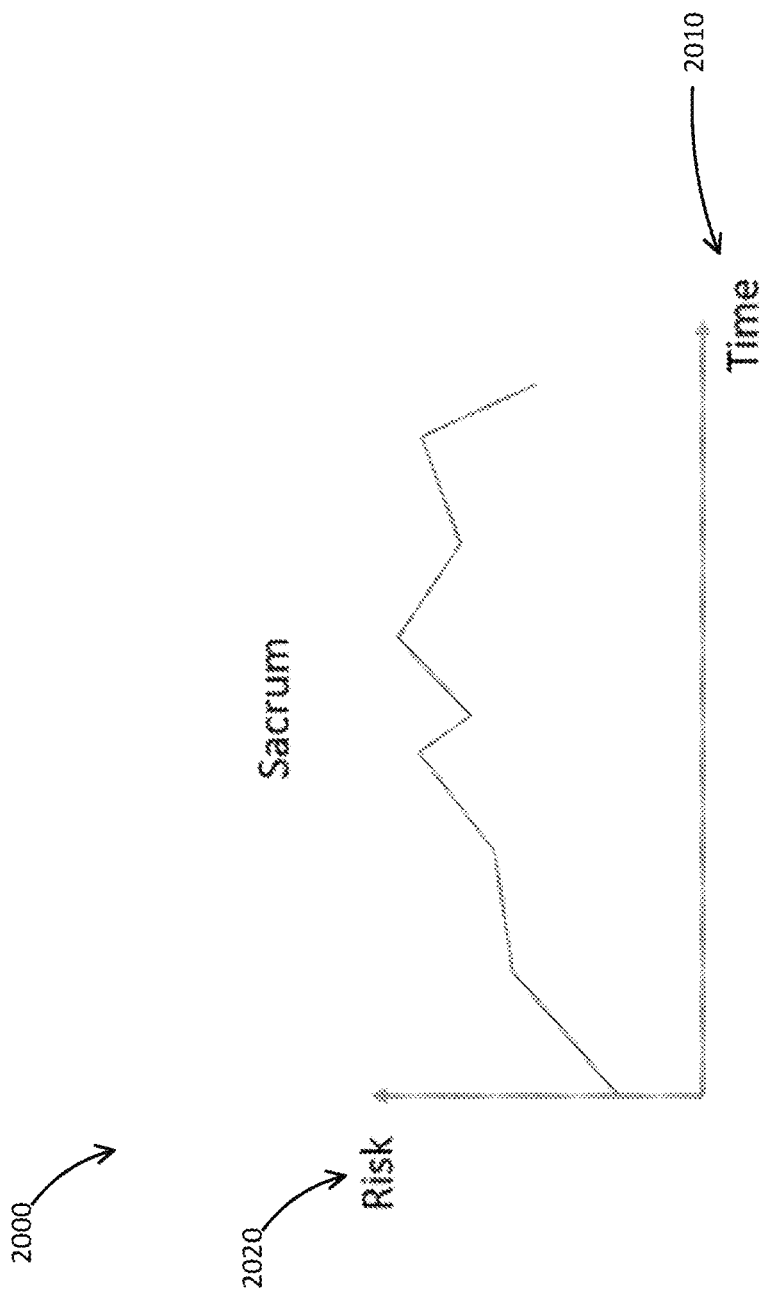
FIG. 20 is a diagrammatic representation of a method for determining a risk of a patient developing a pressure injury according to some embodiments.

By tracking pressure data over time, levels of risk indicating how likely a patient is to develop a pressure injury in a particular area of the body may also be determined and graphically represented. For example, FIG. 20 shows a graph 2000 having an x-axis 2010 showing time and a y-axis 2020 showing a level of risk, with the risk of a pressure injury developing in the sacral region shown over time.

The above embodiments have been described by way of example only and modifications are possible within the scope of the claims that follow.

The invention claimed is:

1. An addressing circuit for a conductor array comprising intersecting row and column conductors, wherein the addressing circuit comprises:
   a switching circuit configured to selectively address an intersection between a selected row conductor and a selected column conductor for connection to a measuring circuit; and at least one voltage buffer selectively connectable to un-selected column conductors on opposite sides of and adjacent to the selected column conductor;

wherein the at least one voltage buffer is configured to equalise voltages between the un- selected column conductors and the selected column conductor.

2. The addressing circuit of claim 1, wherein the at least one voltage buffer comprises two voltage buffers.

3. The addressing circuit as claimed in claim 1, wherein the measuring circuit comprises a transimpedance amplifier.

4. The addressing circuit as claimed in claim 3 wherein the switching circuit comprises an output demultiplexer configured to:

selectively connect the selected column to the transimpedance amplifier; and selectively connect the voltage buffers to the adjacent un-selected column conductors.

5. The addressing circuit of claim 1, wherein the voltage buffers act as current sinks.

6. The addressing circuit as claimed in claim 3, further comprising one or more analogue to digital converters for converting an analogue output of the transimpedance amplifiers into a digital input.

7. The addressing circuit of claim 3, wherein the voltage buffers are configured to set the voltage of the un-selected columns to be equal to the voltage of the input of the transimpedance amplifiers.

8. The addressing circuit as claimed in claim 1, further comprising at least one row buffer connected to each row conductor, each row buffer configured to control the voltage in each row conductor.

9. The addressing circuit as claimed in claim 8 further comprising a voltage source selectively connectable to the at least one row buffer.

10. The addressing circuit of claim 8, wherein the row buffers comprise operational amplifiers.

11. The addressing circuit of claim 8, wherein the row buffers are configured to equalise the voltage of the unselected rows to the voltage of the input of the transimpedance amplifiers.

12. The addressing circuit as claimed in claim 9 further comprising a digital to analogue converter for converting a signal generated by a controller into the voltage source for selectively connecting to each row buffer.

13. The addressing circuit as claimed in claim 8 wherein the switching circuit comprises a phase demultiplexer configured to selectively connect each row buffer to a precision resister.

14. The addressing circuit as claimed in claim 8, further comprising a phase demultiplexer configured to switch a feedback loop and an output when connecting each row buffer to the respective row conductor.

15. The addressing circuit as claimed in claim 1, further comprising a controller for controlling selective connection of the row and column conductors to the switching circuit.

16. The addressing circuit as claimed in claim 15 wherein the controller is configured to receive measured data from the measuring circuit and calculate the changes in at least one electrical characteristic of the selected row and column conductor pair.

17. The addressing circuit of claim 1, wherein the voltage buffers are configured to set the voltage of the un-selected columns to a ground or common mode voltage.

18. The addressing circuit as claimed in claim 1, further comprising a digital to analogue converter for converting a signal generated by a controller into a common voltage for supplying to any voltage buffers, transimpedance amplifiers and row buffers of the addressing circuit.

19. An addressing circuit as claimed in claim 1, wherein the conductor array is a sheet formed of piezoelectric material with the row and column conductors arranged on opposing surfaces of the sheet.

20. The addressing circuit of claim 1, wherein the selected column comprises two or more selected columns.

* * * * *